US012787578B2

(12) United States Patent
Zhou et al.

(10) Patent No.: US 12,787,578 B2
(45) Date of Patent: Nov. 3, 2026

(54) DRIVE BACKPLANE, DISPLAY PANEL, AND DISPLAY APPARATUS

(71) Applicants: Chengdu BOE Optoelectronics Technology Co., Ltd., Chengdu (CN); BOE TECHNOLOGY GROUP CO., LTD., Beijing (CN)

(72) Inventors: Zhenli Zhou, Beijing (CN); Fengli Ji, Beijing (CN); Quan Shi, Beijing (CN); Yanwei Lu, Beijing (CN); Zhuoran Yan, Beijing (CN)

(73) Assignees: CHENGDU BOE OPTOELECTRONICS TECHNOLOGY CO., LTD., Chengdu (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 351 days.

(21) Appl. No.: 18/578,712

(22) PCT Filed: May 31, 2022

(86) PCT No.: PCT/CN2022/096167

§ 371 (c)(1),
(2) Date: Jan. 11, 2024

(87) PCT Pub. No.: WO2023/230817

PCT Pub. Date: Dec. 7, 2023

(65) Prior Publication Data

US 2024/0292691 A1 Aug. 29, 2024

(51) Int. Cl.
*H10K 59/13* (2023.01)
*G11C 19/28* (2006.01)
(Continued)

(52) U.S. Cl.
CPC .......... *H10K 59/131* (2023.02); *G11C 19/28* (2013.01); *G09G 3/3233* (2013.01);
(Continued)

(58) Field of Classification Search
CPC ....... H10K 50/00–88; H10K 59/00–95; H10K 65/00; H10K 71/00–861;
(Continued)

(56) References Cited

U.S. PATENT DOCUMENTS

2019/0219879 A1 7/2019 Imai
2022/0115485 A1* 4/2022 Yu ........................ H10D 86/441
2022/0123087 A1 4/2022 Yu et al.

FOREIGN PATENT DOCUMENTS

CN 103000152 A 3/2013
CN 103472963 A 12/2013
(Continued)

OTHER PUBLICATIONS

Written Opinion Issued in PCT Application No. PCT/CN2022/096167 dated Dec. 12, 2022 with English translation, (3p).
(Continued)

*Primary Examiner* — Moin M Rahman
(74) *Attorney, Agent, or Firm* — Arch & Lake LLP

(57) ABSTRACT

The drive backplane includes a pixel area and a control area outside the pixel area. The control area includes a circuit area and a bus area between the circuit area and the pixel area. The drive backplane includes a substrate and a circuit layer provided on a side of the substrate. The circuit layer includes a plurality of pixel circuits, a plurality of gate lines, a gate drive circuit, bus lines, and a plurality of gate connection lines.

20 Claims, 12 Drawing Sheets

(51) Int. Cl.
*H10K 59/131* (2023.01)
*G09G 3/3233* (2016.01)

(52) U.S. Cl.
CPC ............... *G09G 2300/0426* (2013.01); *G09G 2300/0819* (2013.01); *G09G 2300/0842* (2013.01); *G09G 2300/0861* (2013.01); *G09G 2310/0286* (2013.01); *G09G 2320/0247* (2013.01)

(58) Field of Classification Search
CPC . H10K 85/00–791; H10K 2101/00–90; H10K 2102/00–361; H10K 50/10–19; H10K 50/11; H10K 50/15; H10K 50/16; H10K 50/171; H10K 2101/30; H10K 2101/40; H10K 2102/351; H10K 50/852; H10K 59/35; H10K 59/12; H10K 50/156; H10K 59/131; H10K 59/1213; H10K 59/1216; H10K 59/353; H10K 77/111; H10K 2102/311; B60K 37/02; B60K 2370/1523; B60K 2370/331; B60K 2370/52; B60R 1/00; B32B 2457/206; G09G 2310/0297; G09G 3/3225; G09G 2300/0426; H10D 86/441; H10D 86/481; H10D 86/60; G02F 1/1345
See application file for complete search history.

(56) References Cited

FOREIGN PATENT DOCUMENTS

| | | | |
|---|---|---|---|
| CN | 103715205 | A | 4/2014 |
| CN | 103730085 | A | 4/2014 |
| CN | 103839488 | A | 6/2014 |
| CN | 104614911 | A | 5/2015 |
| CN | 104934458 | A | 9/2015 |
| CN | 103715205 | B | 4/2016 |
| CN | 106847085 | A | 6/2017 |
| CN | 109273516 | A | 1/2019 |
| CN | 109285861 | A | 1/2019 |
| CN | 110047446 | A | 7/2019 |
| CN | 111092108 | A | 5/2020 |
| CN | 111384109 | A | 7/2020 |
| CN | 113725236 | A | 11/2021 |
| CN | 113823671 | A | 12/2021 |
| CN | 114464755 | A | 5/2022 |
| EP | 4012694 | A1 | 6/2022 |
| WO | 2021168731 | A1 | 9/2021 |
| WO | 2021223188 | A1 | 11/2021 |
| WO | 2021223190 | A1 | 11/2021 |
| WO | 2022011582 | A1 | 1/2022 |

OTHER PUBLICATIONS

International Search Report of PCT/CN2022/096167 dated Dec. 12, 2022 with English translation, (4p).
CNOA issued in Application No. 202280001555.0 dated Apr. 8, 2026 with English translation, (29p).

* cited by examiner

DRIVE BACKPLANE, DISPLAY PANEL, AND DISPLAY APPARATUS

CROSS REFERENCE TO RELATED APPLICATION(S)

The present disclosure is a 35 U.S.C. 371 national phase application of PCT International Application No. PCT/CN2022/096167 filed on May 31, 2022, the entire content of which is incorporated herein by reference.

TECHNICAL FIELD

The present disclosure relates to the field of display technology, and specifically to a drive backplane, a display panel, and a display apparatus.

BACKGROUND

Organic Light-Emitting Diode (OLED) display panels have advantages such as self-illumination, wide color gamut, high contrast, flexibility, high response, etc., and have broad application prospects. However, existing display panels may experience abnormal display images such as black screen and flickering.

It should be noted that the information disclosed in the background section is only used to enhance understanding of the background of the present disclosure, and therefore may include information that does not constitute prior art known to those of ordinary skill in the art.

SUMMARY

The present disclosure provides a drive backplane, a display panel, and a display apparatus.

According to an aspect of the present disclosure, a drive backplane is provided. The drive backplane has a pixel area and a control area outside the pixel area. The control area includes a circuit area and a bus area separated between the circuit area and the pixel area. The circuit layer includes:

- a plurality of pixel circuits, arranged in an array in the pixel area;
- a plurality of gate lines, extending along the row direction and arranged along the column direction, the pixel circuits in one row being connected to at least one of the gate lines;
- a gate drive circuit, provided in the control area and including a plurality of gate shift register units cascaded along the column direction;
- bus lines, provided in the bus area, at least some of the bus lines being located between the gate drive circuit and the pixel area, and the bus lines being located on the side of the gate line away from the substrate;
- a plurality of gate connection lines, one of the gate shift register units being connected to one of the gate connection lines, and at least part of one of the gate connection lines being in a different layer from the gate line, and connected to at least one of the gate lines through a contact hole. The gate connection lines are insulated from the bus lines.

In an exemplary embodiment of the present disclosure, the gate connection line includes a first connection part and a second connection part connected to each other. The first connection part is connected to the gate shift register unit and passes through the bus area. The second connection part is spaced apart from the bus line and the pixel circuit, and is connected to at least one of the gate lines. At least one of the first connection part and the second connection part is located on a different layer from the gate line.

In an exemplary embodiment of the present disclosure, the first connection part and the gate line are arranged on the same layer, and the second connection part and the gate line are arranged on different layers.

In an exemplary embodiment of the present disclosure, the first connection part and the second connection part are provided on the same layer, but on a different layer from the gate line and the bus line.

In an exemplary embodiment of the present disclosure, the circuit layer further includes a power line, a data line, and a reset signal line. Both of the power line and the data line extend along the column direction, and are arranged along the row direction. The power line and the data line are arranged on the same layer as the bus line. The reset signal line extends along the row direction, and is arranged along the column direction. The reset signal line is located on a different layer from the gate line and the bus line.

The gate line includes a first gate line and a second gate line.

The pixel circuit includes a storage capacitor and a plurality of transistors. The transistor includes a drive transistor, a write transistor, a compensation transistor, and a first reset transistor. Gates of the compensation transistor and the write transistor are connected to the first gate line. The drive transistor has a first terminal connected to the power line, and a second terminal connected to the light-emitting device. The compensation transistor is connected to the second terminal and the gate of the drive transistor. The write transistor has a first terminal connected to the data line, and a second terminal connected to the first terminal of the drive transistor. The first reset transistor has a gate connected to the second gate line, a first terminal connected to the reset signal line, and a second terminal connected to the gate of the drive transistor. The storage capacitor has a first plate connected to the gate of the drive transistor, and a second plate connected to the power line.

The first gate line connecting the pixel circuit in the n-th row and the second gate line connecting the pixel circuit in the (n+1)-th row are connected to the same gate shift register unit through the same gate connection line.

In an exemplary embodiment of the present disclosure, the circuit layer includes:

- a semiconductor layer, provided on a side of the substrate and including a channel of each transistor;
- a first gate insulation layer, covering the semiconductor layer;
- a first gate layer, provided on the surface of the first gate insulation layer away from the substrate, and including the gate line, the first plate, and the gate of each transistor;
- a second gate insulation layer, covering the first gate layer;
- a second gate layer, provided on the surface of the second gate insulation layer away from the substrate, and including the second plate and the reset signal line;
- a dielectric layer, covering the second gate layer; and
- a source and drain layer, provided on a side of the dielectric layer away from the substrate, and including the bus line, the power line, and the data line.

In an exemplary embodiment of the present disclosure, the first connection part is arranged on the same layer as the gate line, but on a different layer from the second connection part.

The first connection part is connected to the second gate line. The second connection part is located on the source and drain layer, and extends along the column direction. The second connection part is connected to the first gate line through a contact hole.

In an exemplary embodiment of the present disclosure, the first connection part and the second connection part are arranged on the same layer.

The gate connection line is located on the second gate layer.

In an exemplary embodiment of the present disclosure, the first connection part is connected to the gate shift register unit and the second gate line through contact holes. The second connection part extends along the column direction, and is connected to the first connection part. The second connection part is connected to the first gate line through a contact hole.

In an exemplary embodiment of the present disclosure, the gate line further includes a third gate line. The pixel circuit further includes a second reset transistor, a first light emission control transistor, and a second light emission control transistor.

The first light emission control transistor has a gate connected to the third gate line, a first terminal connected to the power line, and a second terminal connected to the first terminal of the drive transistor.

The second light emission control transistor has a gate connected to the third gate line, a first terminal connected to the second terminal of the drive transistor, and a second terminal connected to the light-emitting device.

The second reset transistor has a gate connected to the first gate line, a first terminal connected to the reset signal line, and a second terminal connected to the second terminal of the second light emission control transistor.

In an exemplary embodiment of the present disclosure, the circuit layer further includes:

- a light emission control circuit, located in the control area, the light emission control circuit including a plurality of light emission shift register units cascaded along the column direction; and
- a plurality of light emission connection lines, where one of the light emission shift register units is connected to one of the light emission connection lines, and at least part of one of the light emission connection lines is located on a different layer from the third gate line, and is connected to one of the third gate lines through a contact hole.

In an exemplary embodiment of the present disclosure, the light emission connection line is located on the second gate layer, and is connected to the light emission shift register unit and the third gate line through contact holes.

In an exemplary embodiment of the present disclosure, the light emission connection line includes a third connection part and a fourth connection part. The third connection part is provided in the same layer as the gate line, and is connected to the light emission shift register unit. The third connection part passes through the bus area along the direction. The fourth connection part is located on the source and drain layer or the second gate layer, and is connected to the third connection part and the third gate line through contact holes.

In an exemplary implementation of the present disclosure, the second reset transistor of the pixel circuit in the n-th row is connected to the second gate line of the pixel circuit in the (n+1)-th row.

In an exemplary embodiment of the present disclosure, the bus line includes a test bus line, a reset bus line, and a power bus line located one the source and drain layer. The power line is connected to the power bus line, and the reset signal line is connected to the reset bus line.

In an exemplary embodiment of the present disclosure, the reset bus line is located between the test bus line and the pixel area. The second connection part is located on a side of the reset bus line away from the test bus line, and is arranged adjacent to the reset bus line. The distance between the second connection part and the reset bus line along the row direction is 3 μm-10 μm.

In an exemplary embodiment of the present disclosure, the width of the second connection part is 20%-40% of the width of the reset bus line.

In an exemplary embodiment of the present disclosure, the control area of the drive backplane includes a lead-out area, which extends along the row direction and is spaced apart from the pixel area along the column direction. The bus line, the data line, and the power line are connected to the lead-out area.

The bus area includes side bus areas arranged on both sides of the pixel area along the row direction and a connection bus area connected between the two side bus areas. The connection bus area is located between the lead-out area and the pixel area.

The power bus line is located in the connection bus area.

According to an aspect of the present disclosure, a display panel is provided, including the drive backplane described in any one of the above embodiments.

According to an aspect of the present disclosure, a display apparatus is provided, including the display panel according to any one of the above embodiments.

It should be understood that the foregoing general description and the following detailed description are exemplary and explanatory only, and do not limit the present disclosure.

BRIEF DESCRIPTION OF THE DRAWINGS

The accompanying drawings, which are incorporated in and constitute a part of this specification, illustrate embodiments consistent with the present disclosure and together with the description, serve to explain the principles of the present disclosure. It is noted that the drawings in the following description are only some embodiments of the present disclosure. For those of ordinary skill in the art, other drawings can be obtained based on these drawings without exerting creative efforts.

DETAILED DESCRIPTION OF THE EMBODIMENTS

Figure 1:
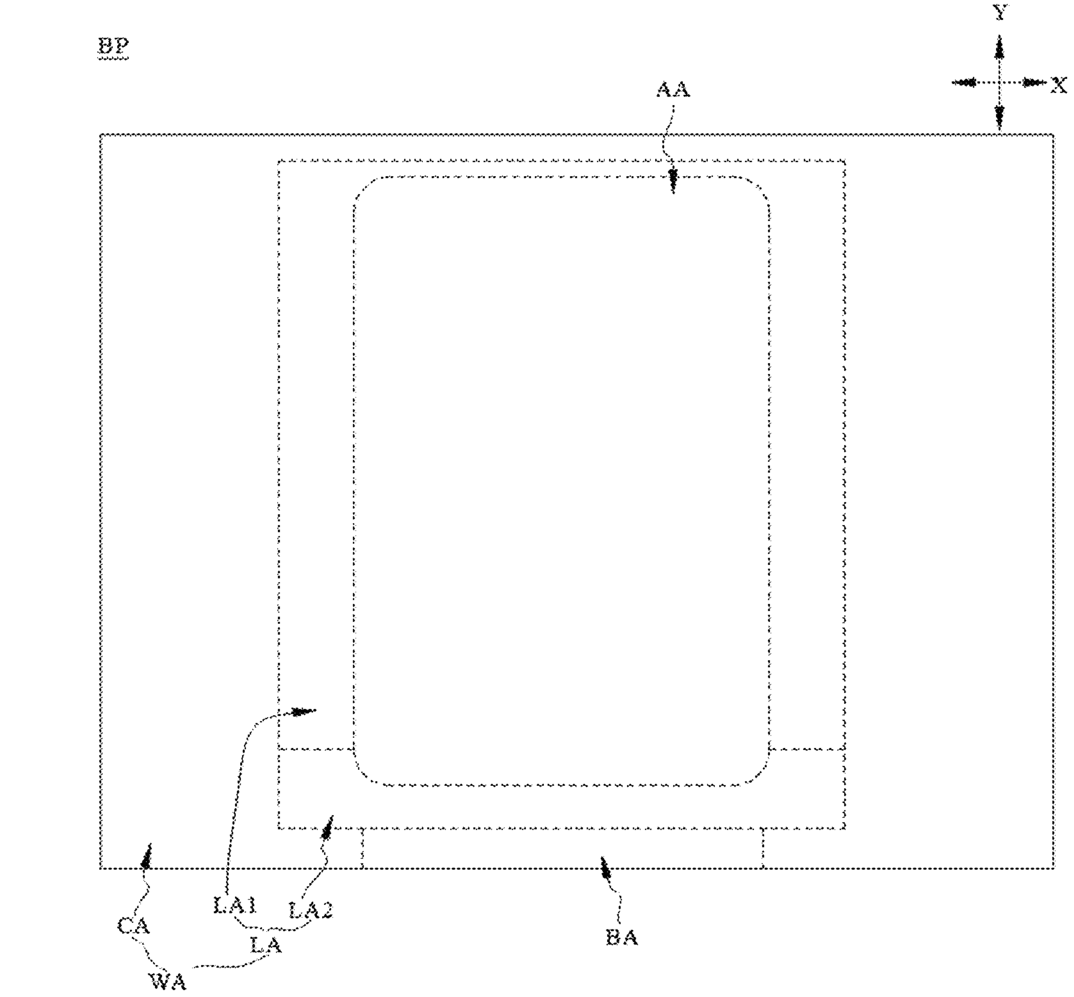
FIG. 1 is a partial cross-sectional schematic diagram of a display panel according to an embodiment of the present disclosure.

Example embodiments will now be described more fully with reference to the accompanying drawings. Example embodiments may, however, be embodied in various forms and should not be construed as limited to the embodiments set forth herein. Rather, these embodiments are provided so that the present disclosure will be thorough and complete, and will fully convey the concepts of the example embodiments to those skilled in the art. The same reference numerals in the drawings indicate the same or similar structures, and thus their detailed descriptions will be omitted. Furthermore, the drawings are merely schematic illustrations of the present disclosure and are not necessarily drawn to scale.

The terms “a”, “an”, “the”, “said”, and “at least one” are used to indicate the presence of one or more elements or components/etc. The terms “include” and “have” are used to indicate a non-exclusive inclusion, and mean that there may be additional elements or components, etc. in addition to those listed. The terms “first”, “second”, “third” etc. are only used as markers, not a limit on the number of the relavant objects.

The row direction X and the column direction Y in the description are only two mutually perpendicular directions. In the drawings of the present disclosure, the row direction may be tranverse and the column direction may be vertical, but the present disclosure is not limited in this regard. If the display panel is rotated, the actual orientations of row direction X and column direction Y may change.

The “overlapping” characteristic between feature A and feature B in the description means that the orthographic projection of feature A on the substrate and the orthographic projection of feature B on the substrate at least partially overlap. The “non-overlapping” characteristic between feature A and feature B in the description means that the overlapping area between the orthographic projection of feature A on the substrate and the orthographic projection of feature B on the substrate is zero.

Feature A and feature B being on the “same layer” in the description means that feature A and feature B may be formed at the same time. Feature A and feature B being on “different layers” means that feature A and feature B are spaced apart in a direction perpendicular to the substrate, and they are separated by another film layer.

Figure 2:
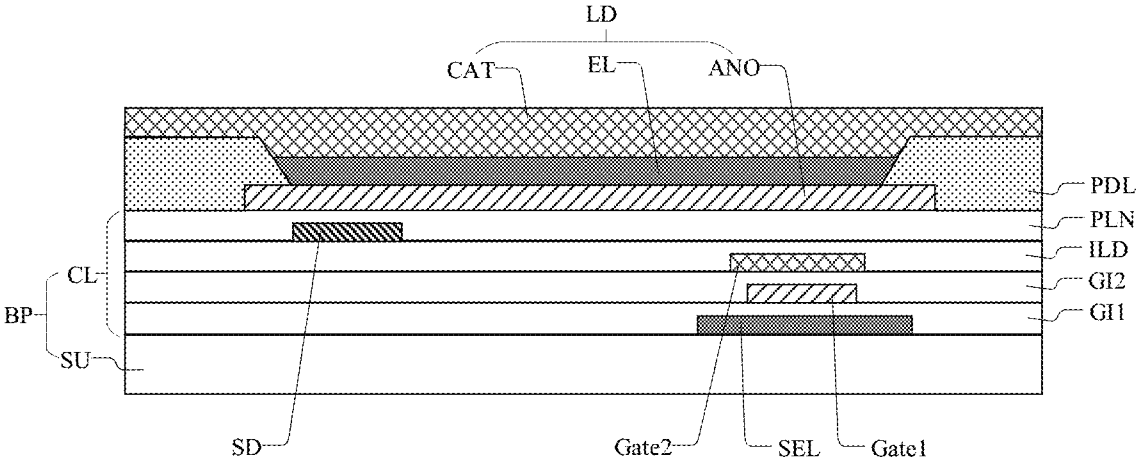
FIG. 2 is a schematic diagram showing the arrangement of various areas in the drive backplane according to an embodiment of the present disclosure.

As shown in FIG. 2, the display panel of the present disclosure may include a drive backplane BP and a light-emitting device LD disposed on one side of the drive backplane BP. The drive circuit in the drive backplane BP can drive the light-emitting device LD to emit light for displaying an image.

The light-emitting device LD may be an organic light-emitting diode (OLED), a quantum dot light-emitting diode (QLED), a Micro LED, or a Mini LED, etc., and may include a first electrode ANO, a second electrode CAT, and a light-emitting layer EL located between the first electrode ANO and the second electrode CAT.

The display panel may be divided into at least a display area the can emit light and a peripheral area outside the display area that cannot emit light. The drive circuit may include a pixel circuit located in the display area and a peripheral circuit located in the peripheral area. On the one hand, the peripheral circuit may be connected to the light-emitting device LD through the pixel circuit, and apply the first power signal VDD to the first electrode ANO of the light-emitting device LD. On the other hand, the peripheral circuit may also be connected to the second electrode CAT of the light-emitting device LD, and apply the second power signal VSS to the second electrode CAT. Thus, the current through the light-emitting device LD may be controlled by controlling the pixel circuit, thereby controlling the brightness of the light-emitting device LD.

As shown in FIGS. 1 and 2, based on the above-mentioned division of the display panel, correspondingly, the drive backplane BP of the present disclosure may at least be divided into a pixel area AA and a control area WA outside the pixel area AA. The pixel area AA is the area corresponding to the display area in the drive backplane BP. The control area WA is the area corresponding to the peripheral area in the drive backpanel BP. Further, the control area WA may include a circuit area CA and a bus area LA separated between the circuit area CA and the pixel area AA.

As shown in FIGS. 1-3 and 11-15, the drive backplane BP of the present disclosure may include a substrate SU and a circuit layer CL provided on one side of the substrate SU. The substrate SU may be flexible transparent material such as polyimide, or a hard transparent material such as glass. The substrate SU may have a multi-layer or single-layer structure. The circuit layer CL may include pixel circuit PC, gate line, gate drive circuit, bus line, and gate connection line.

There may be multiple pixel circuits PC, and they are arranged in an array in the pixel area AA, thereby obtaining multiple rows and multiple columns of pixel circuits PC. One pixel circuit PC may be connected to at least one light-emitting device to drive the light-emitting device to emit light.

There may be multiple gate lines GAL, and at least some of them are located in the pixel area AA. Each gate line GAL extends along the row direction X, and is arranged along the column direction Y. The pixel circuits PC in one row are connected to at least one gate line GAL.

The gate drive circuit GGOA may be disposed in the control area WA, and includes a plurality of gate shift register units GGOAs cascaded along the column direction Y. There are multiple gate connection lines GCL. One gate shift register unit GGOA may be connected to one gate connection line GCL, so that signals can be input to the pixel circuit PC through the gate connection line GCL and the gate line GAL. At the same time, at least part of a gate connection line GCL is in a different layer from the gate line GAL, and is connected to at least one gate line GAL through a contact hole.

The bus lines L are provided in the bus area LA, and at least some of them are located between the gate drive circuit GGOA and the pixel area AA. The bus line L is insulated from the gate connection line GCL.

In the drive backplane BP in an embodiment of the present disclosure, at least some of the gate connection lines GCL connecting the gate line GAL and the gate shift register unit GGOA may be located on a different layer from the gate line GAL, and thus the connection needs to be realized through a contact hole. The existence of the contact hole helps to increase the overall impedance of the gate connection line GCL, improve the ability to block static electricity, play a certain protective role for other circuits, ensure the stable transmission of electrical signals, and avoid abnormal display phenomena such as black screens and flickers. Especially for the gate line GAL that transmits high-frequency pulse signals, this helps to reduce the interference of static electricity on the signal.

The following is a detailed description of the pixel circuit PC and drive circuit.

The pixel circuit PC may include multiple transistors and may also include capacitors. For example, it may be 3T1C, 7T1C, and another pixel circuit PC. nTmC indicates that a pixel circuit PC includes n transistors (indicated by the letter "T") and m capacitors (indicated by the letter "C").

Figure 4:
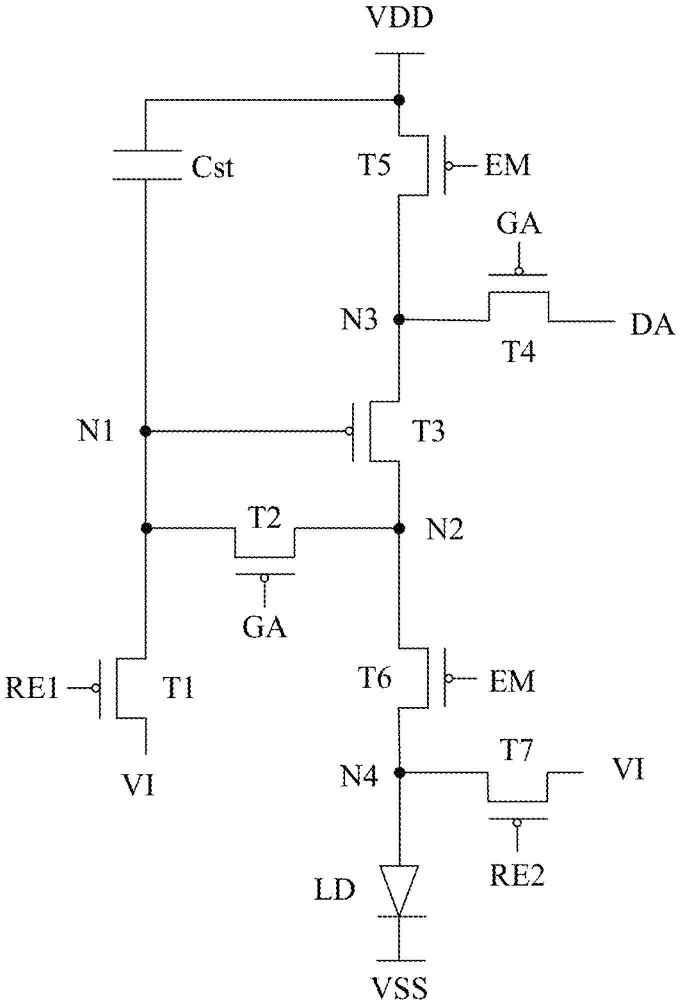
FIG. 4 is a schematic diagram of a pixel circuit in the drive backplane according to an embodiment of the present disclosure.

As shown in FIG. 4, taking a 7T1C structure of pixel circuit PC as an example, it may include a first reset transistor T1, a compensation transistor T2, a drive transistor T3, a write transistor T4, a first light emission control transistor T5, a second light emission control transistor T6, a second reset transistor T7, and a storage capacitor Cst.

The first reset transistor T1 has a gate used to receive the first reset control signal RE1, a first terminal used to receive the reset signal VI, and a second terminal connected to the gate of the drive transistor T3. The first plate of the storage capacitor Cst is connected at the N1 node, and the second plate of the storage capacitor Cst is used to receive the first power signal VDD. The compensation transistor T2 has a gate used to receive the scan signal GA, a first terminal connected to the N2 node along with the second terminal of the drive transistor T3, and a second terminal connected to the N1 node along with the gate of the drive transistor T3. The write transistor T4 has a gate used to receive the scan signal GA, a first terminal used to receive the data signal DA, and a second terminal connected to the N3 node along with the first terminal of the drive transistor T3. The first light emission control transistor T5 has a gate used to receive the light emission control signal EM, a first terminal used to receive the first power signal VDD, and a second terminal connected to the first terminal of the drive transistor T3. The second light emission control transistor T6 has a gate used to receive the light emission control signal EM, a first terminal connected to the N2 node along with the second terminal of the drive transistor T3, and a second terminal connected to the N4 node along with the first terminal of the light-emitting device. The second reset transistor T7 has a gate used to receive the reset control signal REL, a first terminal used to receive the reset signal VI, and a second terminal connected to the N4 node along with the second terminal of the second light emission control transistor T6.

The following explains the operation principle of the pixel circuit PC.

Each transistor of the pixel circuit PC may be a P-type low-temperature polysilicon transistor. Because the P-type low-temperature polysilicon transistors have high carrier mobility, they are conducive to achieving a display panel with high resolution, high response speed, high pixel density, and high aperture ratio. The P-type low-temperature polysilicon transistor may be turned off when a high-level signal is input to its gate, and turned on when a low-level signal is input thereto. It is noted that the transistor may also be an N-type low-temperature polysilicon transistor, which is turned on at a high-level signal. The present description only takes the P-type low-temperature polysilicon transistor as an example.

During the reset phase, the first reset control signal RE1 is a low-level signal, the first reset transistor T1 is turned on, and the reset signal VI is written to the gate of the drive transistor T3 and the first plate of the storage capacitor Cst. As a result, the N1 node is reset to implement initialization, thereby eliminating the influence of the data of the previous image frame.

During the write stage, the scan signal GA can turn on the write transistor T4 and the compensation transistor T2, and the data signal DA is written to the gate of the drive transistor T3 and the first plate Cst1 of the storage capacitor Cst. That is, through the N3 node and the N2 node, the data signal DA is written to the N1 node, until the potential reaches Vdata+vth. Vdata is the voltage of the data signal Da, and Vth is the threshold voltage of the drive transistor T3. The scan signal GA of the write transistor T4 and the compensation transistor T2 may be the same signal. At the same time, the second reset control signal RE2 is a low-level signal, causing the second reset transistor T7 to be turned on. The second reset signal VIN2 is written to the first electrode of the light-emitting device LD and the second terminal of the second light emission control transistor T6. Thus, the N4 node is reset to implement initialization, and further eliminate the influence of the data of the previous image frame.

During the light-emitting phase, the light emission control signal EM is a low-level signal, the first light emission control transistor T5 and the second light emission control transistor T6 are turned on, and the drive transistor T3 is turned on under the effect of the voltage Vdata+Vth stored in the storage capacitor Cst and the first power signal VDD. At this time, the light-emitting device LD emits light.

Further, as shown in FIGS. 3 and 5 to 9, in order to facilitate signal input to the pixel circuit PC, in addition to the gate line GAL, the circuit layer also includes a power line VDL, a data line DAL, a first reset signal line VIL1, and a second reset signal line VIL2.

The power lines VDL may extend along the column direction Y and be arranged along the row direction X. The power lines VDL may be connected to the first light emission control transistor T5 and the second plate Cst2 of the storage capacitor Cst for transmitting the first power signal VDD. The data lines DAL may also extend along the column direction Y and be arranged along the row direction X. The data lines DAL may be connected to the first terminal of the write transistor T4 for transmitting the data signal DA.

The first reset signal line VIL1 and the second reset signal line VIL2 both extend along the row direction X and are arranged along the column direction Y. The first reset signal line VIL1 may be connected to the first terminal of the first reset transistor T1 for transmitting the reset signal VI. The second reset signal line VIL2 may be connected to the first terminal of the second reset transistor T7 for transmitting the reset signal VI. The two reset signals VI may be the same or different.

In order to simplify the structure, in some embodiments, the same reset signal line may be used to simultaneously input the reset signal to the second reset transistor T7 of the pixel circuit PC in the n-th row and the first reset transistor T1 of the pixel circuit PC in the (n+1)-th row. That is to say, the second reset signal line VIL2 connected to the pixel circuit PC in the n-th row may be multiplexed as the first reset signal line VIL1 connected to the pixel circuit PC in the (n+1)-th row. To this end, the first terminal of the second reset transistor T7 of the pixel circuit PC in the n-th row may be connected to the first terminal of the first reset transistor T1 of the pixel circuit PC in the (n+1)-th row, and is further connected to the same reset signal line (the first reset signal line VIL1 and the second reset signal line VIL2). In this way, the number of reset signal lines can be reduced.

There may be multiple gate lines GAL, and they all extend along the row direction X and are arranged along the column direction Y. The gate line GAL may be used to transmit the scan signal GA, the first reset control signal RE1, the second reset control signal RE2, and the light emission control signal EM, thereby controlling the on or off state of other transistors except the drive transistor T3. For example, the gate line GAL may include a first gate line GAL1, a second gate line GAL2, a third gate line GAL3, and a fourth gate line GAL4.

The first gate line GAL1 may be connected to the gates of the write transistor T4 and the compensation transistor T2 at the same time, and simultaneously transmit the scan signal GA to the write transistor T4 and the compensation transistor T2. The second gate line GAL2 may be connected to the gate of the first reset transistor T1 for transmitting the first reset control signal RE1. The third gate line GAL3 may be connected to the gates of the first light emission control transistor T5 and the second light emission control transistor T6 at the same time for transmitting the light emission control signal EM. The fourth gate line GAL4 may be connected to the gate of the second reset transistor T7 for transmitting the second reset control signal RE2.

Since the write transistor T4, the compensation transistor T2, and the second reset transistor T2 are all turned on during the light-emitting phase, the first gate line GAL1 and the fourth gate line GAL4 connected to the same pixel circuit PC can receive a signal at the same time, and the signal may serve as the scan signal GA and the second reset control signal RE2 simultaneously. At the same time, the first gate line GAL1 connected to the pixel circuit PC in the n-row may be connected with the second gate line GAL2 connected to the first reset transistor T1 of the pixel circuit PC in the (n+1)-row. Thus, while the pixel circuit PC in the n-th row is in the write stage, the pixel circuit PC in the (n+1)-th row may be in the reset stage.

In view of above, the fourth gate line GAL4 connected to the second reset transistor T7 of the pixel circuit PC in the n-th row, and the second gate line GAL2 connected to the first reset transistor T7 of the pixel circuit PC in the (n+1)-th row may be the same gate line GAL. That is to say, the fourth gate line GAL4 connected to the pixel circuit PC in the n-th row is multiplexed as the second gate line GAL2 of the pixel circuit PC in the (n+1)-th row, which is beneficial to simplifying the structure and shortening the refresh time.

Based on the above pixel circuit PC, in some embodiments, as shown in FIG. 2, the circuit layer CL includes a semiconductor layer SEL, a first gate insulation layer GI1, a first gate layer GAT1, a second gate insulation layer GI2, a second gate layer GAT2, a dielectric layer ILD, a source and drain layer SD, and a planarization layer PLN.

Figure 5:
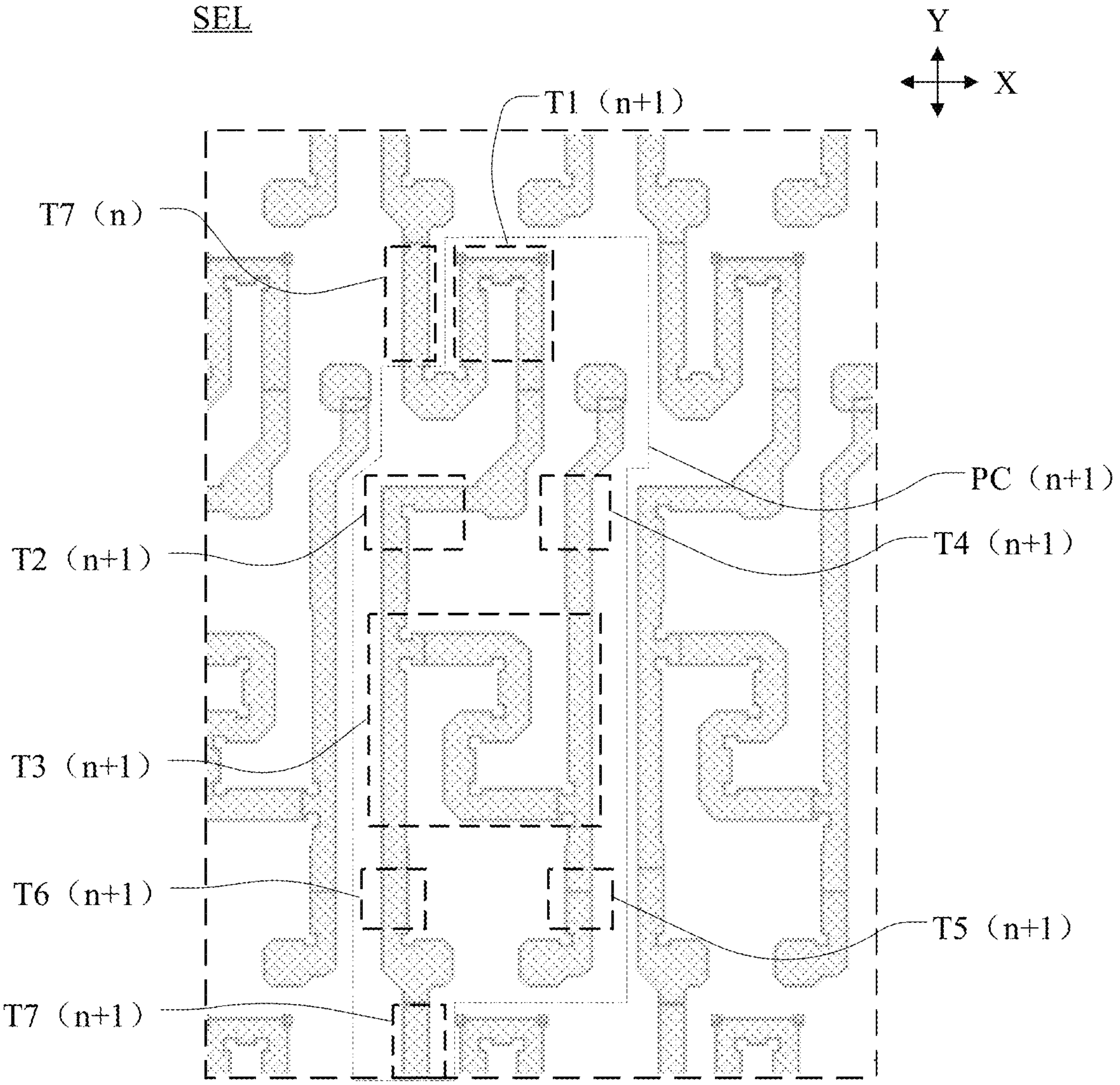
FIG. 5 is a partial top view of the semiconductor layer in the drive backplane according to an embodiment of the present disclosure.
Figure 9:
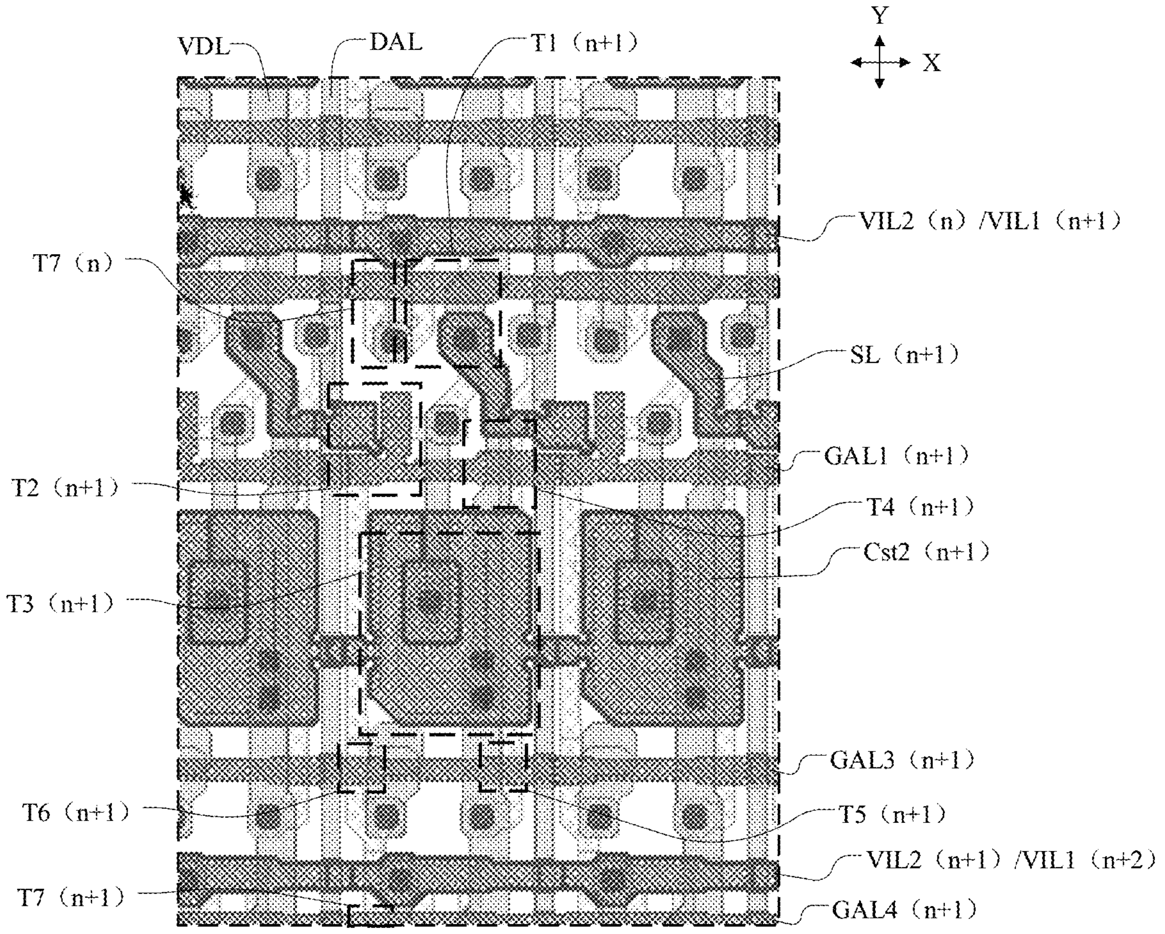
FIG. 9 is a partial top view of a pixel circuit in the drive backplane according to an embodiment of the present disclosure.

As shown in FIGS. 5 and 9, the semiconductor layer SEL may be disposed on one side of the substrate SU and includes channels of each transistor. The material of the semiconductor layer SEL may be low-temperature polysilicon or the like. The channel of the second reset transistor T7 of the pixel circuit PC in the n-th row may be connected to the channel of the first reset transistor T1 of the pixel circuit PC in the (n+1)-th row.

The first gate insulation layer GI1 may cover the semiconductor layer SEL, and the material thereof may be insulation materials such as silicon nitride and silicon oxide.

Figure 6:
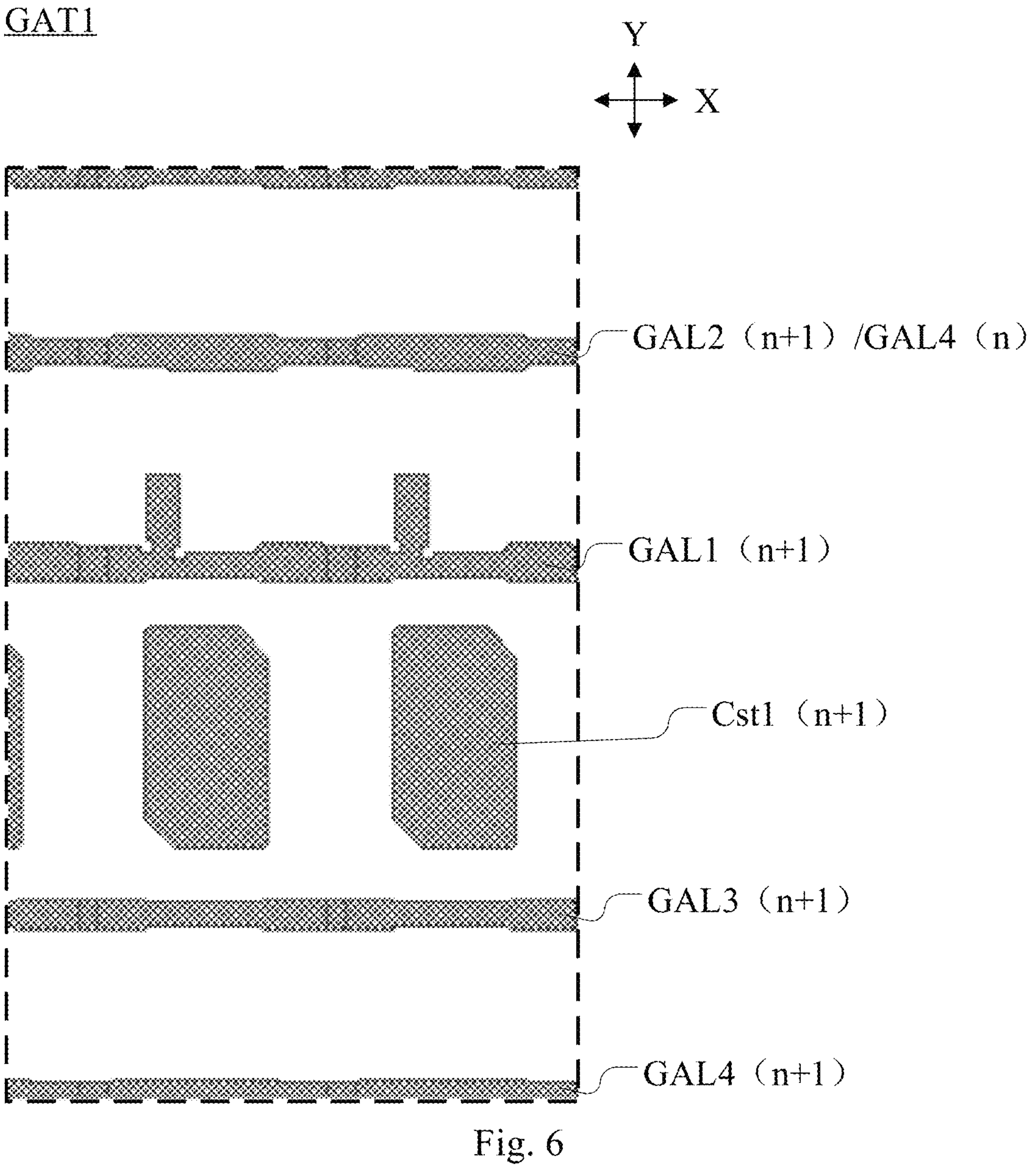
FIG. 6 is a partial top view of the first gate layer in the drive backplane according to an embodiment of the present disclosure.

As shown in FIGS. 6 and 9, the first gate layer GAT1 may be disposed on the surface of the first gate insulation layer GI1 away from the substrate SU. The material of the first gate layer GAT1 may be metal, some metal oxides, or other conductive materials. The first gate layer GAT1 may include each gate line GAL and the first plate Cst1 of the storage capacitor Cst.

The second gate insulation layer GI2 may cover the first gate layer GAT1, and the material thereof may be silicon nitride, silicon oxide, or other insulation materials. The material of the second gate insulation layer GI2 may be the same as that of the first gate insulation layer GI1.

Figure 7:
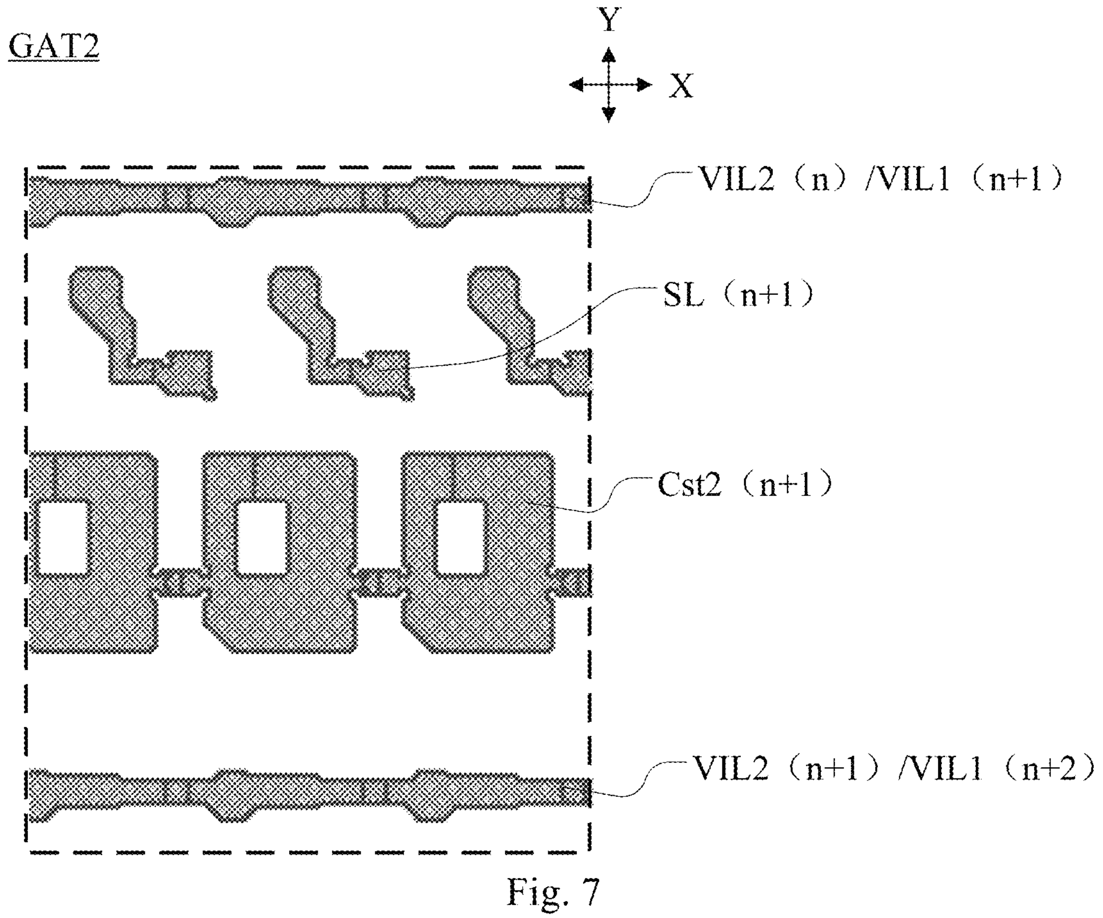
FIG. 7 is a partial top view of the second gate layer in the drive backplane according to an embodiment of the present disclosure.

As shown in FIGS. 7 and 9, the second gate layer GAT2 may be disposed on the surface of the second gate insulation layer GI2 away from the substrate SU. The material of the second gate layer GAT2 may be metal, some metal oxides, or other conductive materials. The second gate layer GAT2 may include a first reset signal line VIL1, a second reset signal line VIL2, and a second plate Cst2.

If the second reset signal line VIL2 connected to the pixel circuit PC in the n-th row is multiplexed as the first reset signal line VIL1 connected to the pixel circuit PC in the (n+1)-th row, then the semiconductor layer SEL between the channel of the second reset transistor T7 of the pixel circuit PC in the n-th row and the channel of the first reset transistor T1 of the pixel circuit PC in the (n+1)-th row may be connected to the first reset signal line VIL1.

In some embodiments of the present disclosure, the compensation transistor T2 may be a dual-gate transistor with two channels. The second gate layer GAT2 may also include a shielding part SL, which may be provided between the first reset signal line VIL1 and the second plate Cst2, and overlap with the area between the two channels of the compensation transistor T2, reducing the the electrical leakage of the compensation transistor T2.

The dielectric layer ILD may cover the second gate layer GAT2, and the dielectric layer ILD may also be made of insulation materials such as silicon nitride and silicon oxide.

Figure 8:
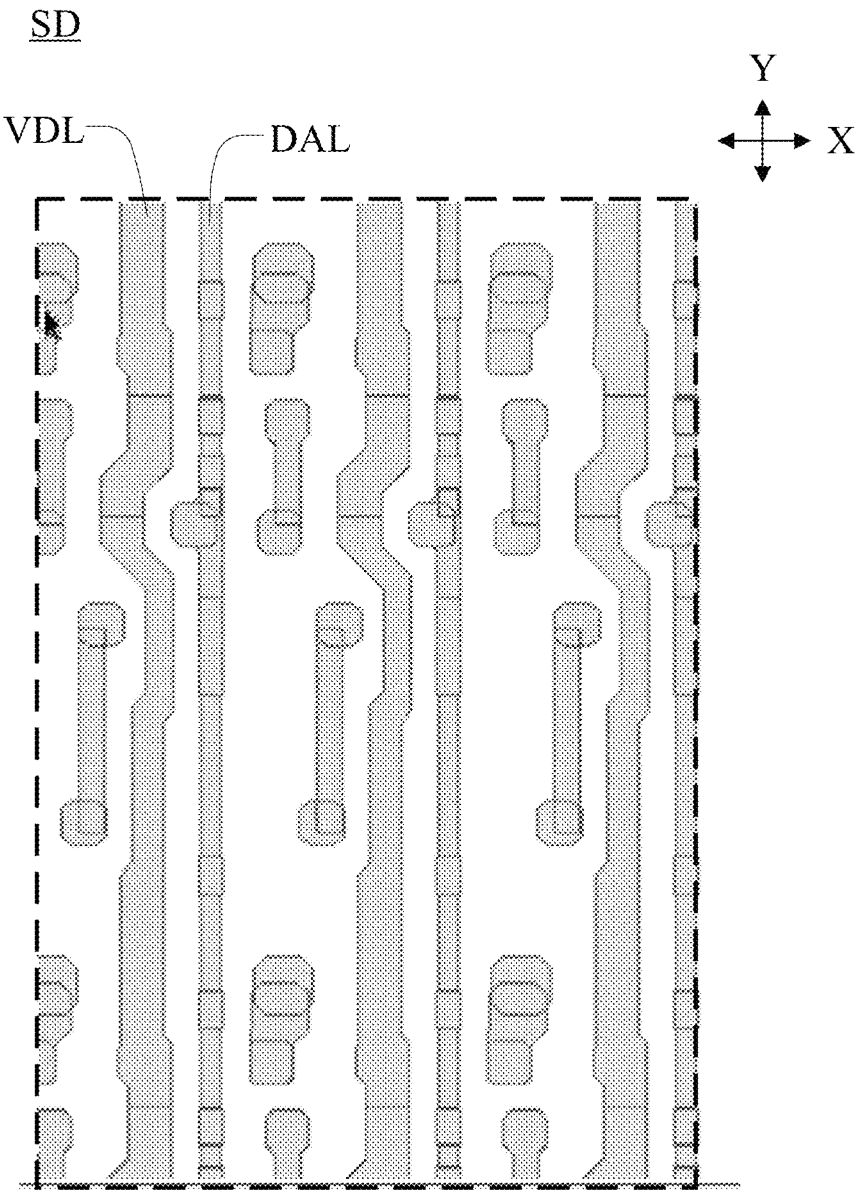
FIG. 8 is a partial top view of the source and drain layer in the drive backplane according to an embodiment of the present disclosure.

As shown in FIGS. 8 and 9, the source and drain layer SD is provided on the surface of the dielectric layer ILD away from the substrate SU. The source and drain layer SD may be made of metal, some metal oxides, or other conductive materials. The first source and drain layer SD may include a data line DAL and a power line VDL. At the same time, it may also include a transmission part SDc. The transmission part SDc is overlapped with the semiconductor layer SEL between the channel of the second reset transistor T7 of the pixel circuit PC in the n-th row and the channel of the first reset transistor T1 of the pixel circuit PC in the (n+1)-th row, and is connected therewith through a contact hole. At the same time, the transmission part SDc is also connected through the contact hole to the above first reset signal line VIL1 multiplexed as the second reset signal line VIL2, so that a reset signal can be transmitted to the second reset transistor T7 in the n-th row and the first reset transistor T1 in the (n+1)-th row.

As shown in FIGS. 3, 10, 13, and 14, the gate drive circuit GGOA may include multiple cascaded gate shift register units GGOAs, which may provide signals for multiple rows of gate lines GAL, thereby controlling the transistors connected to the multiple rows of gate lines GAL to be turned on in sequence. At the same time, the data line provides a data signal to the pixel circuit PC connected thereto to form the grayscale voltage required to display each grayscale of the image, thereby controlling the brightness of the light-emitting device and displaying an image frame.

The number of the gate drive circuit GGOA may be one, and it is located on one side of the pixel area AA. The gate shift register unit GGOA may drive at least one row of pixel circuits PC. Alternatively, the number of the gate drive circuits GGOAs may be two, and they are located on both sides of the pixel area AA. The gate shift register units GGOAs of the two gate drive circuits GOA may be set in one-to-one correspondence. The pixel circuits PC in the same row may simultaneously receive signals provided by the corresponding gate shift register units GGOAs on both sides.

Figure 10:
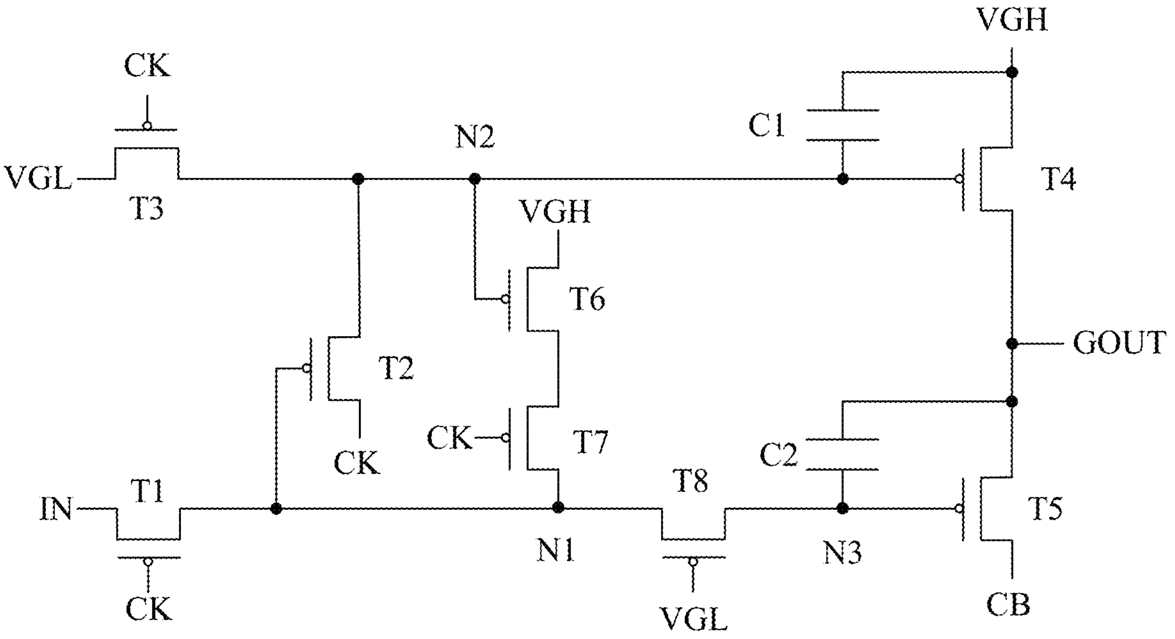
FIG. 10 is a schematic diagram of a gate shift register unit in the drive backplane according to an embodiment of the present disclosure.

As shown in FIG. 10, the gate shift register unit GGOA includes 8 transistors and 2 capacitors, including an input transistor T1, a first control transistor T2, a second control transistor T3, an output control transistor T4, a gate output transistor T5, a first noise reduction transistor T6, a second noise reduction transistor T7, a voltage stabilizing transistor T8, a first capacitor C1, and a second capacitor C2.

The gate shift register units GGOAs are cascaded. The first terminal of the input transistor T21 in the first-stage gate shift register unit GGOA is connected to the input terminal IN. The input terminal IN is used to connect to the trigger signal line GSTV for receiving the trigger signal STV as an input signal. The first terminal of the input transistor T1 in the gate shift register unit GGOA of other stages is electrically connected to the output terminal of the gate shift register unit GGOA in the previous stage, so as to receive the output signal output by the output terminal GOUT of the gate shift register unit GGOA in the previous stage as an input signal, thereby realizing the shift output for scanning the pixel circuits PC in the display area row by row.

As shown in FIG. 10, the gate of the input transistor T1 is connected to the first clock signal terminal CK (the first clock signal terminal CK is connected to the first sub-clock signal line GCK) to receive the first clock signal. The second terminal of the input transistor T1 is connected to the input terminal IN, and the first terminal of the input transistor T1 is connected to the first node N1. For example, when the gate shift register unit GGOA is the first-stage gate shift register unit GGOA, the input terminal IN is connected to the trigger signal line GSTV to receive the trigger signal. When the gate shift register unit GGOA is the gate shift register unit GGOA in various stages other than the first-stage gate shift register unit GGOA, the input terminal IN is connected to the output terminal GOUT of the gate shift register unit GGOA in the previous stage.

The gate of the first control transistor T2 is connected to the first node N1. The second terminal of the first control transistor T2 is connected to the first clock signal terminal CK to receive the first clock signal. The first terminal of the first control transistor T2 and the second node N2 are connected to the gate of the second control transistor T3 and the first clock signal terminal CK to receive the first clock signal. The second terminal of the second control transistor is connected to the second drive power line VGL to receive the second voltage. The first terminal of the second control transistor T3 is connected to the second node N2.

The gate of the output control transistor T4 is connected to the second node N2. The first terminal of the output control transistor T4 is connected to the first drive power line VGH to receive the first voltage. The second terminal of the output control transistor T4 is connected to the output terminal GOUT.

The first terminal of the first capacitor is connected to the second node N2. The second terminal of the first capacitor C1 is connected to the first drive power line VGH.

The gate of the output transistor T5 is connected to the third node N3. The first terminal of the output transistor T5 is connected to the second clock signal terminal CB. The second terminal of the output transistor T5 is connected to the output terminal GOUT.

The first terminal of the second capacitor C2 is connected to the third node N3. The second terminal of the second capacitor C2 is connected to the output terminal GOUT.

The gate of the first noise reduction transistor T6 is connected to the second node N2. The first terminal of the first noise reduction transistor T6 is connected to the first drive power line VGH to receive the first voltage. The second terminal of the first noise reduction transistor T6 is connected to the second terminal of the second noise reduction transistor T7.

The gate of the second noise reduction transistor T7 is connected to the second clock signal terminal CB (the second clock signal terminal CB is connected to the second sub-clock signal line GCB) to receive the second clock signal. The first terminal of the second noise reduction transistor T7 is connected to the first node N1.

The gate of the voltage stabilizing transistor T8 is connected to the second drive power line VGL to receive the second voltage. The second terminal of the voltage stabilizing transistor T8 is connected to the first node N1. The first terminal of the voltage stabilizing transistor T8 is connected to the third node N3.

The transistors in the gate shift register unit GGOAs in FIG. 10 are all explained using P-type transistors as an example. That is, each transistor is turned on when the gate is connected provided with a low-level signal, and is turned off when the gate is provided with a high-level signal. At this time, the first terminal of the transistor may be the source, and the second terminal of the transistor may be the drain.

For the operation principle of the gate-scanning gate shift register unit, references may be made to the introduction in the art, and will not be described in detail here.

It should be noted that markings (T1-T8) for the transistor and the capacitor in the circuit of the gate shift register unit GGOA are the same as the markings (T1-T4) for the transistor in the pixel circuit PC above. But, the same marking is merely used for different circuits, and the same marking on a transistor does not indicate the same transistor.

For the above-mentioned gate drive circuit GGOA, the channel of each transistor may be located on the semiconductor layer SEL, the gate of each transistor and one plate of the capacitor may be located on the first gate layer GAT1, and the other plate of the capacitor may be located on the second gate layer GAT2. The first drive power line VGH, the second drive power line VGL, the trigger signal line GSTV, the first sub-clock signal line GCK, and the second sub-clock signal line GCB are located on the source and drain layer SD. The first drive power line VGH, the second drive power line VGL, the trigger signal line GSTV, the first sub-clock signal line GCK, and the second sub-clock signal line GCB are all located on the side of the gate drive circuit GGOA away from the display area.

As shown in FIG. 3, and FIGS. 16-18, the bus line L is located in the bus area LA, and is connected to the lead-out area BA. The bus line L may at least include the power bus line LVD and the reset bus line LV1. Each power line VDL is connected to the power bus line LVD to simultaneously transmit the first power signal VDD. The reset bus line LV1 may be connected to the first reset signal line VIL1 and the second reset signal line VIL2 for transmitting the reset signal VI. At the same time, the bus line L may also include a test bus line LT, which may transmit test signals for testing the display effect of the display panel. Accordingly, the peripheral area may also have a test unit connected to the test bus line LT for sending out test signals. The test bus line LT may be located on the side of the reset bus line LV1 away from the display area. The number of test bus lines LT may be multiple, for example, two, and they may be arranged at intervals on the side of the reset bus line LV1 away from the display area. The power bus line LVD may be located on the side of the reset bus line LV1 close to the display area.

The space occupied by the power bus line LVD may be reduced by shortening the length thereof, so that the range of the peripheral area can be narrowed. The following is an example.

Figure 3:
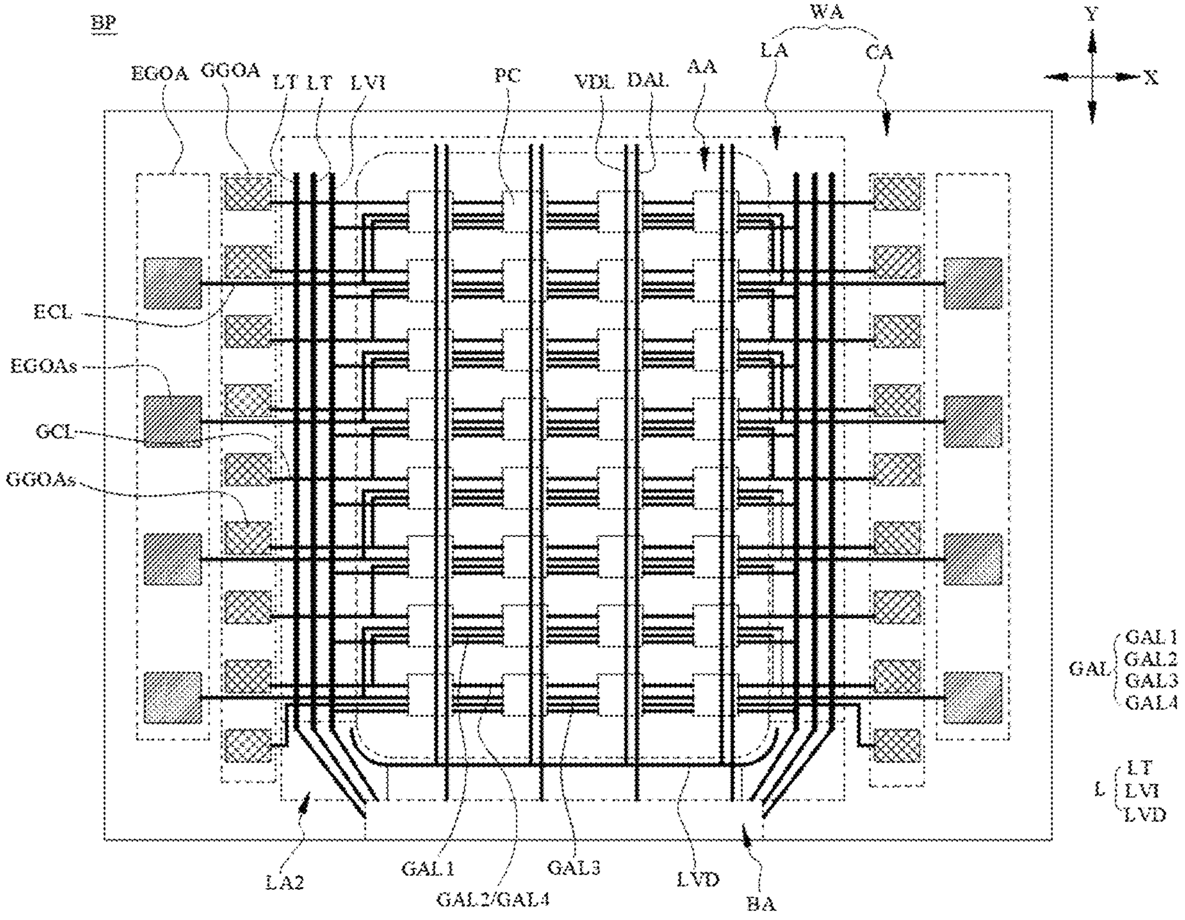
FIG. 3 is a schematic diagram showing the arrangement of circuits in the drive backplane according to an embodiment of the present disclosure.

In some embodiments of the present disclosure, as shown in FIG. 3, the control area WA of the drive backplane may include a lead-out area BA. The lead-out area BA may extend along the row direction X and be spaced apart from the pixel area AA along the column direction Y. The lead-out area BA may be provided with a bonding area. The bus line L, data line DAL, power line VDL, and the above-mentioned first drive power line VGH, second drive power line VGL, trigger signal line GSTV, first sub-clock signal line GCK and second sub-clock signal line GCB may be connected to the bonding area of the lead-out area BA, so as to be bonded to the flexible circuit board through bonding area. The flexible circuit board may be equipped with a control chip and may be bonded to a control motherboard. As a result, the display panel may be controlled by the control chip and the control motherboard to realize functions such as image display and testing.

Figure 17:
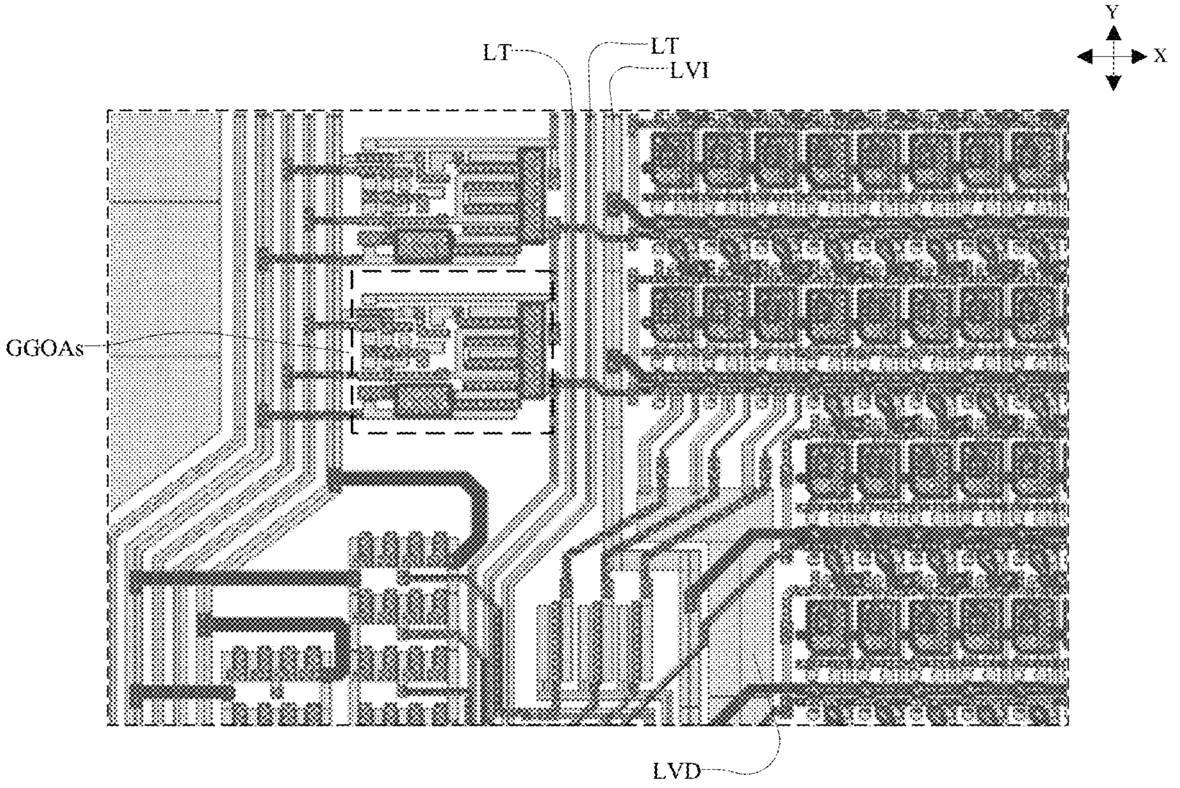
FIG. 17 is a partial schematic diagram of the power bus line of a drive backplane according to an embodiment of the present disclosure.
Figure 18:
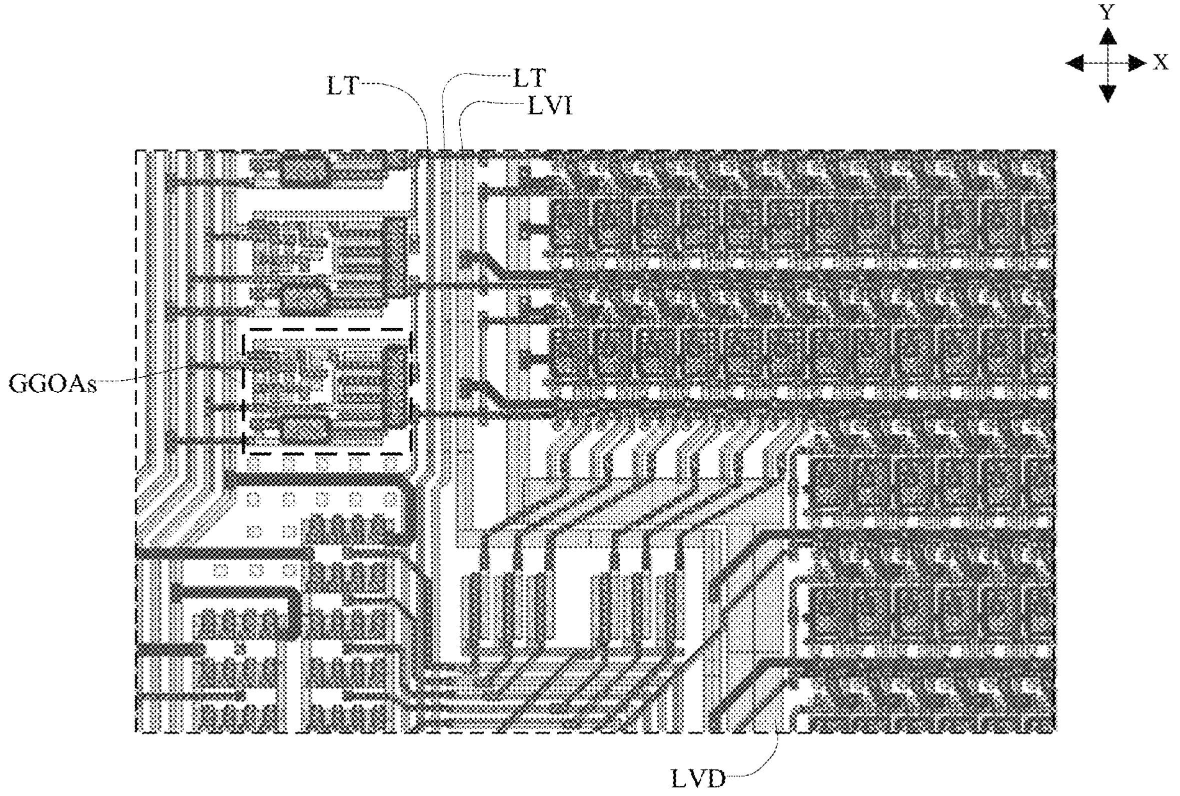
FIG. 18 is a partial schematic diagram of the power bus in a drive backplane according to another embodiment of the present disclosure.

Further, as shown in FIG. 3 and FIG. 17, in some embodiments of the present disclosure, the bus area LA may include side bus areas LA1 arranged along the row direction X on both sides of the pixel area AA, and a connection bus area LA2 connected between the two side bus areas LA1. The connection bus area LA2 may be located between the lead-out area BA and the pixel area AA. Both the reset bus line LV1 and the test bus line LT may have a connection bus area LA2 extending to the two side bus areas LA1. The width of the reset bus line LV1 may be greater than the width of other bus lines L, and the power bus LVD thereof may be the bus line L closest to the pixel area AA among the bus lines L. That is, there is no other bus line L between the power bus line LVD and the pixel area AA. The power bus line LVD may only be located in the connection bus area LA2 and not extend into the side bus area LA1. This is beneficial to narrowing the width of the peripheral area in the row direction X and increasing the screen-to-body ratio.

Figure 13:
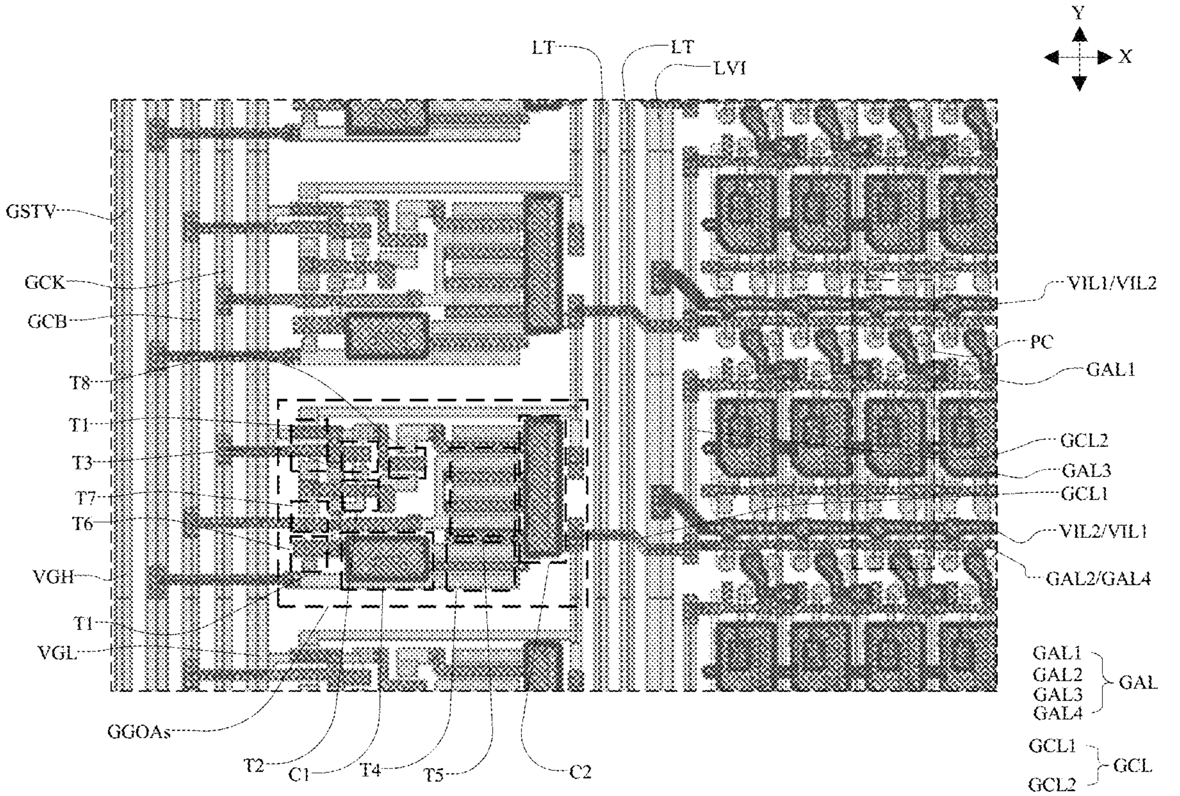
FIG. 13 is a partial schematic diagram of the first type of drive backplane according to a third embodiment of the present disclosure.
Figure 14:
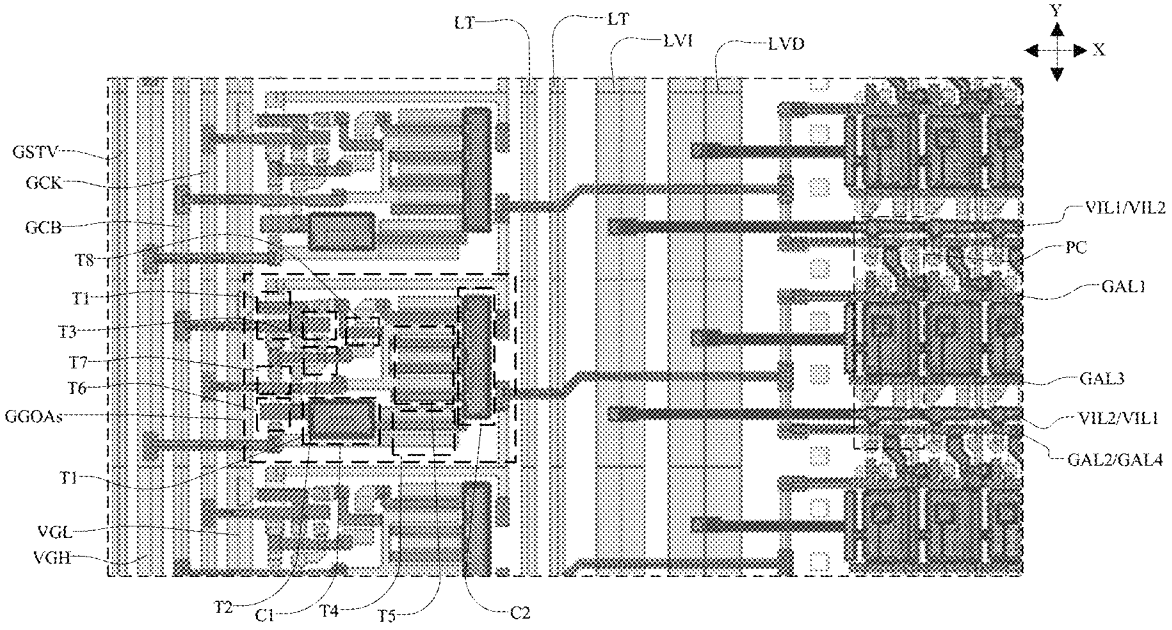
FIG. 14 is a partial schematic diagram of the first type of drive backplane according to a fourth embodiment of the present disclosure.

In other embodiments of the present disclosure, as shown in FIGS. 13, 14, and 17, the power bus line LVD may extend into the side bus area LA1 and surround the outside of the pixel area AA.

As shown in FIGS. 11 to 15, there are multiple gate connection lines GCL, one gate shift register unit GGOA may be connected to one gate connection line GCL, and one gate connection line GCL may be connected to at least one gate line GAL. Therefore, signals may be input to the pixel circuit PC through the gate connection line GCL and the gate line GAL. At the same time, at least some of the gate connection lines GCL are located on a different layer from the gate line GAL, and are connected to the gate line GAL through the contact hole. That is to say, in the process of connecting the gate connection line GCL to the gate line GAL, it needs to be done through the contact hole. The existence of the contact hole will increase the impedance of the gate connection line GCL, which is beneficial to improving the shielding ability against static electricity. In addition, for the gate connection line GCL connected to the first gate line GAL1, the second gate line GAL2, and the fourth gate line GAL4, due to the high frequency of the pulse signal it transmits, the requirements in different reset stages, write stages, and light-emitting stages can be met. This high-frequency pulse signal is more susceptible to the influence of static electricity. By increasing the resistance of at least some of the gate connection lines GCL, the interference of static electricity can be weakened.

For example, based on the multiplexing of the gate line GAL in the above embodiment of the pixel circuit PC, the first gate line GAL1 connected to the pixel circuit PC in the n-row and the second gate line GAL2 connected to the first reset transistor T1 of the pixel circuit PC in the (n+1)-row may be connected to the same gate shift register unit GGOA through the same gate connection line GCL. This kind of connection allows the first gate line GAL1 and the fourth gate line GAL4 connected to the same pixel circuit PC to be connected through the same gate connection line GCL with the same gate shift register unit GGOA. In the following, based on this kind of connection, the specific implementation method of the gate connection line GCL is exemplified.

As shown in FIGS. 11 to 15, the gate connection line GCL may include a first connection part GCL1 and a second connection part GCL2 connected to each other. The first connection part GCL1 may be connected to the gate shift register unit GGOA (output terminal GOUT), and passes through the bus area LA. The second connection part GCL2 may be located in the pixel area AA or the bus area LA, and be connected to at least one gate line GAL. At least one of the first connection part GCL1 and the second connection part GCL2 is located on a different layer from the gate line GAL.

Figure 11:
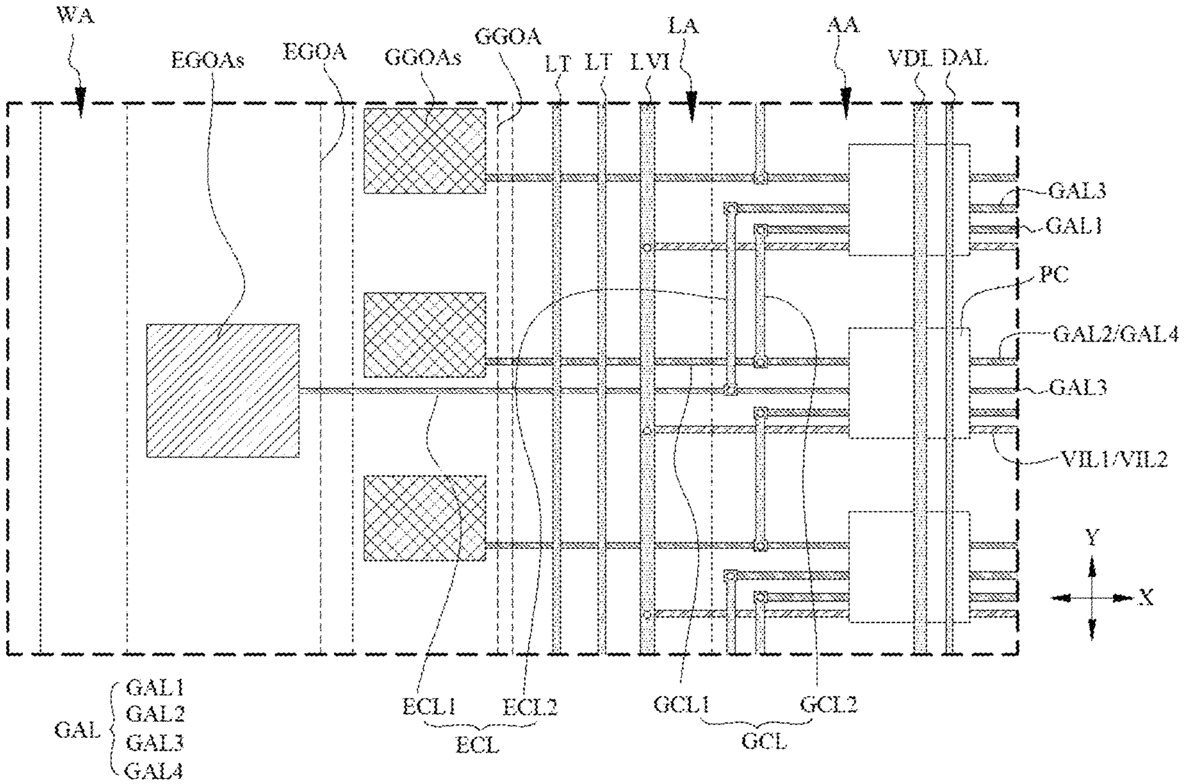
FIG. 11 is a partial schematic diagram of the first type of drive backplane according to a first embodiment of the present disclosure.

In the first type of implementation of the present disclosure, as shown in FIG. 11 and FIG. 14, the first connection part GCL1 and the gate line GAL are arranged on the same layer, and the second connection part GCL2 and the gate line GAL are located on different layers. For example, the first connection part GCL1 is located on the first gate layer GAT1, and the second connection part GCL2 may be located on the source and drain layer SD or the second gate layer GAT2, as long as it can be connected to the gate line GAL through the contact hole.

In a first embodiment of the first type, as shown in FIGS. 11, 13, and 14, the first connection part GCL1 may extend along the row direction X, and may be connected to the output terminal of the gate shift register unit GGOA through the contact hole, and connected to the second gate line GAL2. Since the first connection part GCL1 and the gate line GAL are arranged on the same layer, they may be formed into an integrated structure with the second gate line GAL2.

The second connection part GCL2 is located on the source and drain layer SD, and extends along the column direction Y. The second connection part GCL2 may be connected to the first connection part GCL1 through the contact hole, and is connected to the first gate line GAL1 through the contact hole. The second connection part GCL2 may be located in the display area, and located between the reset bus line LV1 and the column of pixel circuits PC closest to the bus area LA. That is, the second connection part GCL2 is located on the side of the reset bus line LV1 away from the test bus line.

Furthermore, the first connection part GCL1 passes through the bus area LA along the row direction X, and overlaps with each bus line L. The second connection part GCL2 is arranged adjacent to the reset bus line LV1. That is, there is no other wiring between the reset bus line LV1 and the second connection part GCL2. The distance between the second connection part GCL2 and the reset bus line LV1 along the row direction X may be 3 μm-10 μm. For example, the distance may be 4.5 μm. On the one hand, it helps to prevent the second connection part GCL2 from being too close to the reset bus line LV1 and causing the parasitic capacitance to increase too much, which is beneficial to reducing power consumption. On the other hand, it helps to prevent the distance from being too far and causing the width of the peripheral area to increase too much, which would be not conducive to reducing the frame width.

The width of the second connection part GCL2 is 20%-40% of the width of the reset bus line. For example, the width of the second connection part GCL2 is 3.5 μm, and the width of the reset bus line is 10 μm.

Figure 12:
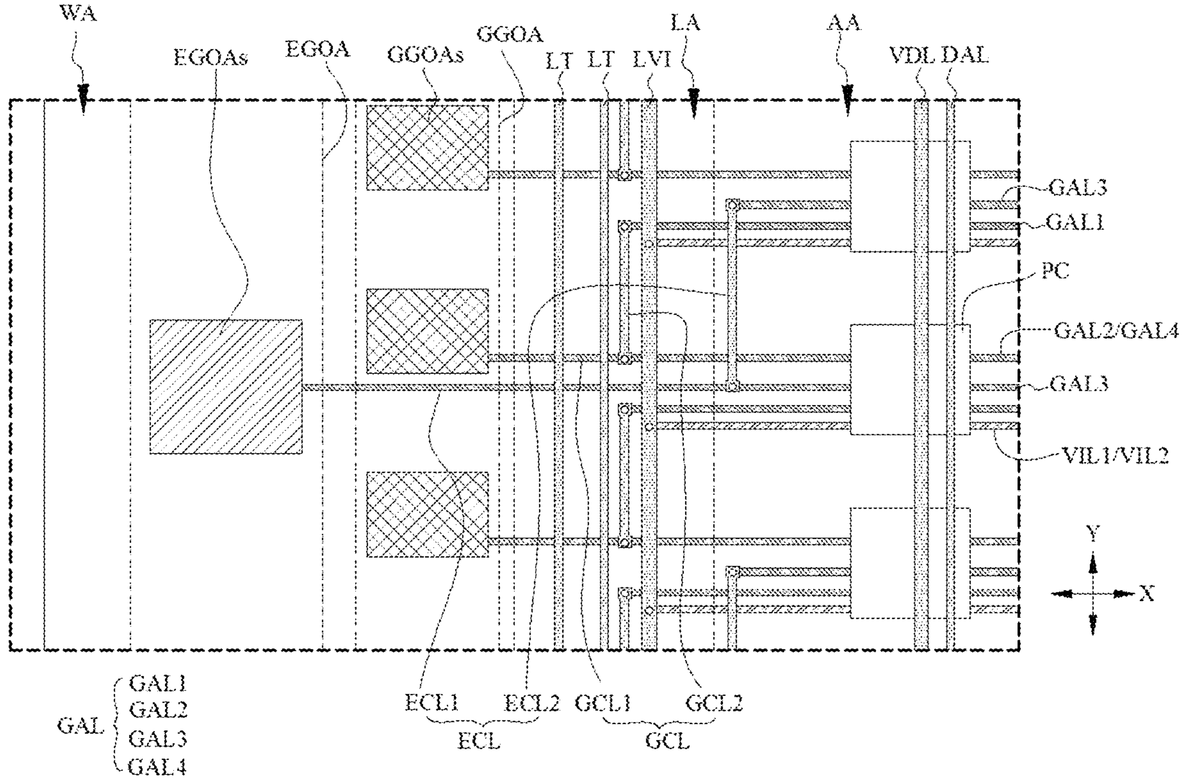
FIG. 12 is a partial schematic diagram of the first type of drive backplane according to a second embodiment of the present disclosure.

In a second embodiment of the first type, as shown in FIG. 12, the connection way of the first connection part GCL1 and the second connection part GCL2, as well as the film layer where they are located, are the same as those in the above-mentioned first embodiment, and will not be detailed here. The difference is in that the second connection part GCL2 may be located in the bus area LA. But in order to avoid a short circuit with the bus line L, it may be set apart from the bus line L, for example, set between a test bus line LT and a reset bus line LV1.

Figure 15:
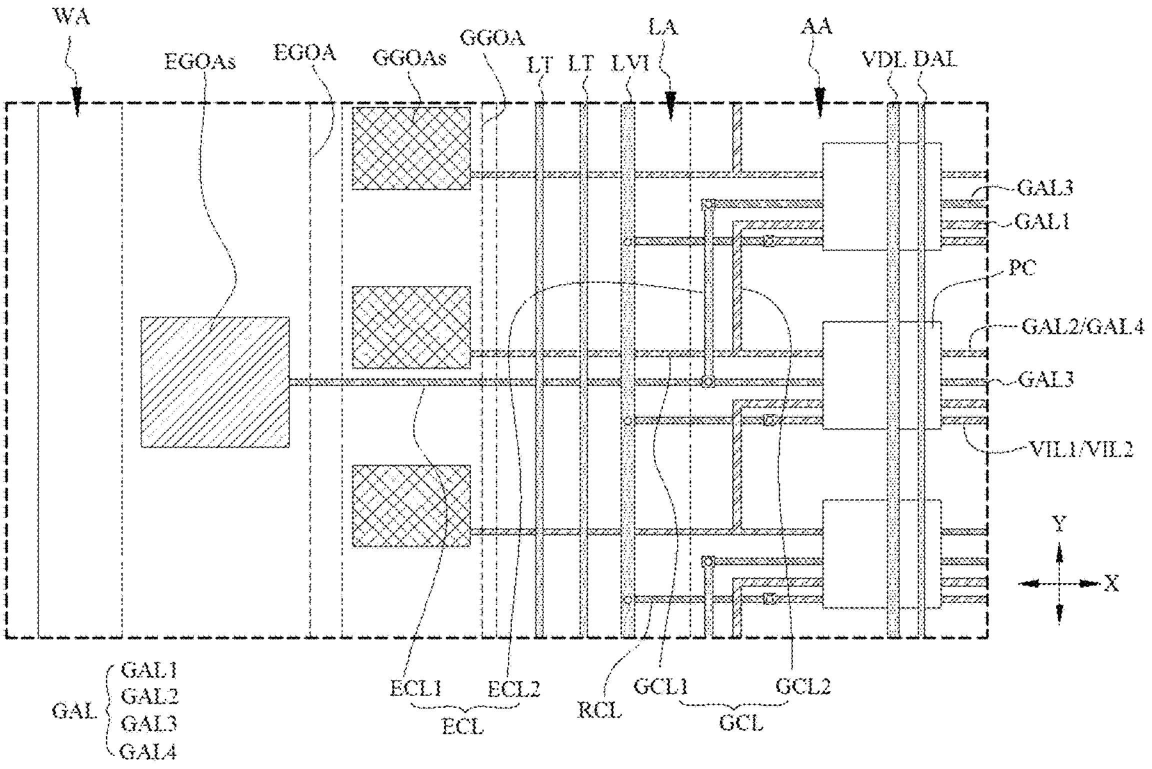
FIG. 15 is a partial schematic diagram of the second type of drive backplane according to a first embodiment of the present disclosure.

In a third embodiment of the first type, as shown in FIG. 15, the connection way of the first connection part GCL1 and the second connection part GCL2 is the same as that in the above-mentioned first and second embodiments, and will not be described in detail here. The difference is in that the second connection part GCL2 is located on the second gate layer GAT2 and extends along the column direction Y. The second connection part GCL2 may be connected to the first connection part GCL1 through the contact hole, and connected to the first gate line GAL1 through the contact hole. Accordingly, the second connection part GCL2 may be located in the display area, and located between the reset bus line LV1 and the column of pixel circuits PC closest to the bus area LA. Alternatively, the second connection part GCL2 may also be located in the bus area LA and spaced apart from the bus line L.

In the third embodiment of the first type, as shown in FIG. 15, the first connection part GCL1 may also be located on the second gate layer GAT2, and the second connection part GCL2 is located on the same layer as the gate line, that is, located on the first gate layer GAT1. The first connection part GCL1 may pass through the bus area LA along the row direction X, and is connected to the gate shift register unit GOA through the contact hole. The first connection part GCL1 is further connected to the second connection part GCL2 and the second gate line GAL2 through the contact hole. The second connection part GCL2 may be connected to the first gate line GAL1.

In a fourth embodiment of the first type, as shown in FIG. 14, based on the above-described first embodiment, both ends of the second connection part GCL2 may be connected with the first gate line GAL1 and the second gate line GAL2 through contact holes respectively. The second connection part GCL2 may be connected to the first connection part GCL1 through a contact hole. That is to say, the second connection part GCL2 is provided with at least three contact holes.

In a fifth embodiment of the first type, the circuit layer CL may also include a light-shielding layer, which may be disposed on one side of the substrate SU and covered by an insulation layer. The semiconductor layer SEL may be disposed on one side of the insulation layer away from the substrate SU. The light-shielding layer may have a light-shielding part that overlaps with the channel of the driving transistor to block light from irradiating the drive transistor. The second connection part GCL2 may be located on the light-shielding layer.

In other embodiments of the first type, the gate connection line GCL may not be limited to the structures of the first connection part GCL1 and the second connection part GCL2 described above, and may include more line segments. At least some of these line segments are located on the first gate layer GAT1, and the others thereof may be located on at least one of the second gate layer GAT2 and the source and drain layer SD, as long as the connection between the gate shift register unit GGOA and the first gate line GAL1 and the second gate line GAL2 can be realized, without any direct contact with the bus line. Thus, no repeated description is provided herein.

In the second type of implementation of the present disclosure, the gate connection line GCL is located on the same layer. For example, the first connection part GCL1 and the second connection part GCL2 of the gate connection line GCL are provided on the same layer, but are on a different layer from the gate line and the bus line, so that contact holes are needed for them to connect with the gate line.

In a first embodiment of the second type, as shown in FIG. 15, the gate connection line GCL is located on the second gate layer GAT2. The first connection part GCL1 of the gate connection line GCL may extend along the row direction X and pass through the bus area LA, and is connected to the gate shift register unit GGOA and connected to the second gate line GAL2 through the contact hole. The second connection part GCL2 and the first connection part GCL1 have an integrated structure, extend along the column direction Y, and are connected to the first gate line GAL1 through contact holes.

In a second embodiment of the second type, the circuit layer CL may also include a light-shielding layer, which may be disposed on one side of the substrate and covered by an insulation layer. The semiconductor layer SEL may be disposed on a side of the insulation layer away from the substrate SU. The light-shielding layer may have a light-shielding part that overlaps with the channel of the drive transistor to block light from irradiating the drive transistor. The gate connection line GCL may be located on the light-shielding layer, and for its specific structure and connection way, references may be made to the first embodiment of the second type, which will not be described in detail here.

Further, as shown in FIGS. 11, 12, and 15, in order to control the on/off timing of the light emission control transistor, the circuit layer CL also includes a light emission control circuit EGOA, which may be provided in the control area WA. The light emission control circuit EGOA includes a plurality of light emission shift register units EGOAs cascaded along the column direction Y. The structure and the operation principle of the light emission shift register units EGOAs are similar to the gate shift register units GGOAs, which may control the light emission control transistors of each row of pixel circuits PC to be turned on and off in sequence. For example, the light emission shift register unit EGOA may be connected to the third gate line GAL3 and output the light emission control signal EM to the third gate line GAL3. In some embodiments of the present disclosure, the light emission shift register unit EGOA may be connected to the third gate line GAL3 to which the two rows of pixel circuits PC are connected.

For example, in some embodiments, as shown in FIG. 3, the light emission control circuit EGOA may be located on a side of the gate drive circuit GGOA away from the pixel area AA (that is, outside the gate drive circuit GGOA), and is arranged at intervals from the gate drive circuit GGOA. Furthermore, the number of the light emission control circuits EGOA and the gate drive circuit GGOAs is both two, and the gate drive circuits GGOAs are separated on both sides of the pixel area AA. The light emission control circuit EGOA is located outside the gate drive circuit GGOA. One row of pixel circuits PC may be connected to two light emission shift register units EGOAs and two gate shift register units GGOAs, so as to prevent the response speed of the same row of pixel circuits PC from being too different due to signal attenuation.

Figure 16:
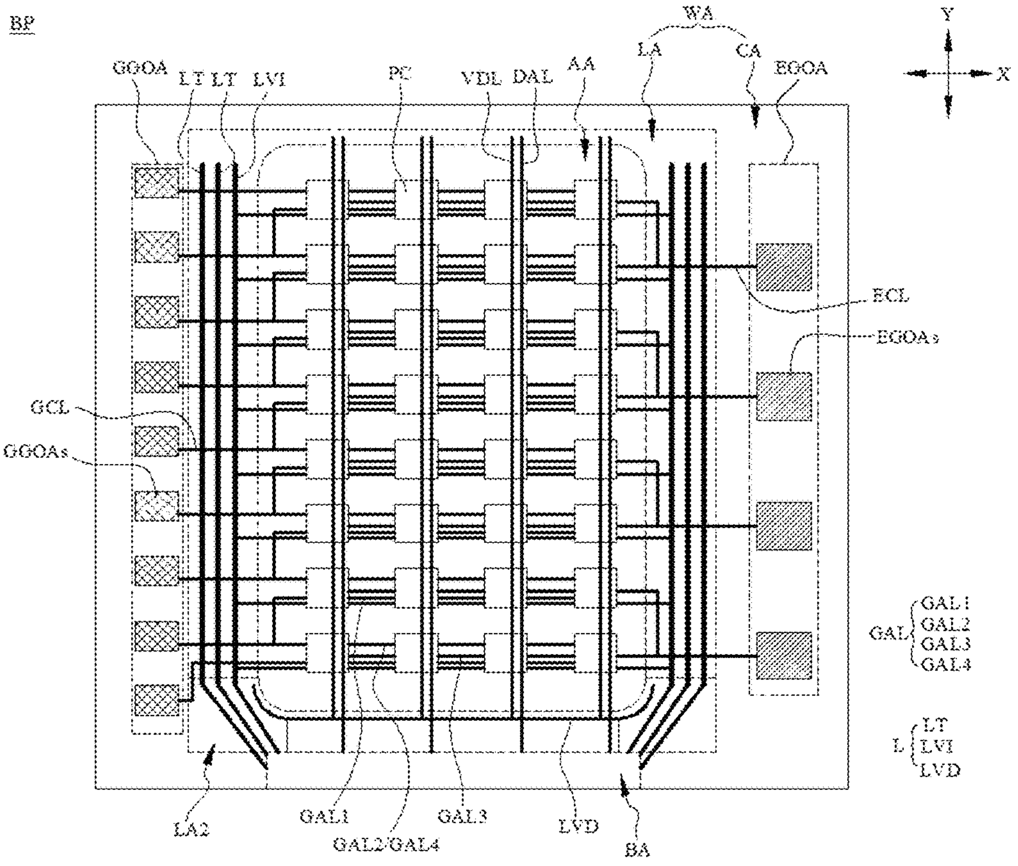
FIG. 16 is a schematic diagram showing the arrangement of circuits in the drive backplane according to another embodiment of the present disclosure.

In some embodiments, as shown in FIG. 16, the number of the light emission control circuit EGOA and the gate drive circuit GGOA may be both one, and may be separated on both sides of the pixel area AA, as long as signals can be transmitted to each row of pixel circuits PC. This helps to shorten the width of the control area to narrow down the frame.

In order to realize the connection between the light emission shift register unit EGOA and the third gate line GAL3, the circuit layer CL may also include a plurality of light emission connection lines ECL. One light emission shift register unit EGOA is connected to one light emission connection line ECL. At least par of one light emission connection line ECL is located on a different layer from the third gate line GAL3, and is connected to a third gate line GAL3 through a contact hole.

The inventor(s) has found that although the light-emitting time of the light-emitting device LD is longer than the reset and write time, and as a pulse signal, the frequency of the light emission control signal EM is lower than the frequencies of the scan signal GA and the reset control signals RE1 and RE2, but the light emission control signal EM may still be affected by static electricity. Therefore, contact holes may also be introduced between the light emission shift register unit EGOA and the third gate line GAL3 to increase the impedance, thereby improving the anti-static capability.

Similar to the structure of the above-mentioned gate connection line GCL, at most some of the light emission connection lines ECL are on the same layer as the gate line GAL, and thus a contact hole is required for connecting to the third gate line GAL3. Therefore, the resistance can be increased by introducing a contact hole, thereby improving the ability to block static electricity.

As shown in FIGS. 11, 12, and 15, the light emission connection line CGL may include a third connection part CGL1 and a fourth connection part CGL2. The third connection part CGL1 is provided on the same layer as the gate line GAL, that is, located on the first gate layer GAT1. The third connection part CGL1 is connected to the light emission shift register unit EGOA and passes through the bus area LA in a direction. The fourth connection part CGL2 is located on the source and drain layer SD or the second gate layer GAT2, and is connected to the third connection part CGL1 and the third gate line GAL3 through the contact holes.

In addition, the light emission connection line ECL may be located on the second gate layer GAT2, and connected to the light emission shift register unit EGOA and the third gate line GAL3 through the contact hole.

The structure and the connection way of the light emission connection line ECL may refer to the gate connection line GCL mentioned above, the third connection part ECL1 may refer to the first connection part GCL1, and the fourth connection part ECL2 may refer to GCL2, as long as the resistance can be increased through the contact hole. Detailed examples will not be given here. However, it should be noted that the light emission connection line ECL cannot be in direct contact with the bus line L and the gate connection line GCL to avoid short circuits.

Further, for the second type of implementation described above, the reset signal lines (the second reset signal line VIL2 connected to the pixel circuit PC in the n-th row and the first reset signal line VIL1 connected to the pixel circuit PC in the (n+1)-th row) extend along the row direction X, and are connected to the reset bus line LV1 through the reset connection line RCL. In order to avoid the fourth connection part CGL2 and the second connection part GCL2 from intersecting with the reset connection line RCL, the reset connection line RCL thereof may be located on the first gate layer GAT1, and the reset connection line RCL may be connected with the reset bus line LV1. The reset connection line may be located on the second gate layer GAT2, and is connected to the reset connection line RCL through the contact hole. The reset connection line RCL overlaps with the fourth connection part CGL2 and the second connection part GCL2, but can maintain insulation therefrom.

It is noted that the connection between the reset signal line and the reset bus line LV1 can also be achieved by using the reset connection line RCL of other film layers, as long as the short circuit with the fourth connection part CGL2 and the second connection part GCL2 can be avoided.

As shown in FIG. 2, an embodiment of the present disclosure provides a display panel, which may include a drive backplane BP and a light-emitting device LD.

The drive backplane BP may be the drive backplane BP in any of the above embodiments, and the structure thereof will not be described in detail here.

The light-emitting device LD may be disposed on a side of the circuit layer CL away from the substrate SU, and connected to the pixel circuit PC. There may be multiple light-emitting devices LD, and each light-emitting device LD may be connected to a pixel circuit PC. The same pixel circuit PC may be connected to one or more light-emitting devices LD. The light-emitting device LD may be an organic light-emitting diode (OLED), a quantum dot light-emitting diode (QLED), a Micro LED, or a Mini LED, etc., and may include a first electrode ANO, a second electrode CAT, and a light-emitting layer located between the first electrode ANO and the second electrode CAT.

Taking OLED as an example, the first electrode ANO may be disposed on the surface of the circuit layer CL away from the substrate SU, for example, on the surface of the second planarization layer PLN2 away from the substrate SU. The light-emitting layer EL may include a hole injection layer, a hole transport layer, a light-emitting material layer, an electron transport layer, and an electron injection layer stacked in a direction away from the drive backplane BP. Each light-emitting device LD may share the second electrode CAT. That is to say, the second electrode CAT may be a continuous whole-layer structure. The second electrode CAT may extend to the peripheral area, and may receive the second power signal VSS. The first electrodes ANOs are arranged in an array to ensure that each light-emitting device LD can emit light independently. In addition, in order to limit the light-emitting range of the light-emitting device LD and prevent crosstalk, a pixel definition layer PDL may be provided on the surface where the first electrode ANO is provided, and the pixel definition layer PDL may have openings exposing various first electrodes ANO. The light-emitting layer EL is stacked with the first electrode ANO in the opening.

Each light-emitting device LD may at least share the light-emitting material layer, so that the light emission color of each light-emitting device LD is the same. At this time, in order to achieve color display, a color film layer may be provided on the side of the light-emitting device LD away from the substrate SU. Through the filter part corresponding to each light-emitting device LD in the color film layer, color display is realized. It is noted that the light-emitting material layer of each light-emitting device LD may also be made independent, so that the light-emitting device LD can directly emit monochromatic light, and the light emission colors of different light-emitting devices LD can be different, thereby achieving color display.

In addition, the display panel may also include an encapsulation layer covering each light-emitting device LD, and may also include other film layers such as a touch layer and a transparent cover plate disposed on a side of the encapsulation layer away from the substrate SU, which will not be described in detail here.

The present disclosure also provides a display apparatus, which may include the display panel described in any of the above embodiments. The display panel is a display panel according to any of the above embodiments. For its specific structure and beneficial effects, reference may be made to the above embodiments of the display panel and will not be described again here. The display apparatus of the present disclosure may be an electronic device with a display function such as a mobile phone, a tablet computer, a television, etc., which will not be listed here.

Other embodiments of the present disclosure will be readily apparent to those skilled in the art from consideration of the specification and practice of the content disclosed herein. This application is intended to cover any variations, uses, or adaptations of the present disclosure that follow the general principles of the present disclosure and include common knowledge or customary technical means in the technical field that are not disclosed in the present disclosure.

The invention claimed is:

1. A drive backplane, comprising a pixel area and a control area outside the pixel area, wherein the control area comprises a circuit area and a bus area between the circuit area and the pixel area;

the drive backplane comprises a substrate and a circuit layer provided on a side of the substrate; and the circuit layer comprises:

a plurality of pixel circuits, provided in an array in the pixel area;

a plurality of gate lines, extending along a row direction and arranged along a column direction, the pixel circuits in one row being connected to at least one of the gate lines;

a gate drive circuit, provided in the control area and comprising a plurality of gate shift register units cascaded along the column direction;

bus lines, provided in the bus area, at least some of the bus lines being located between the gate drive circuit and the pixel area; and a plurality of gate connection lines, wherein one of the gate shift register units is connected to one of the gate connection lines;

at least part of one of the gate connection lines is located on a different layer from the gate line and connected to at least one of the gate lines through a contact hole, and the gate connection line is insulated from the bus line.

2. The drive backplane according to claim 1, wherein the gate connection line comprises a first connection part and a second connection part connected to each other, wherein the first connection part is connected to the gate shift register unit and passes through the bus area;

the second connection part is spaced apart from the bus line and the pixel circuit, and is connected to at least one of the gate lines; and at least one of the first connection part and the second connection part is arranged on a different layer from the gate line.

3. The drive backplane according to claim 2, wherein the first connection part and the gate line are arranged on the same layer, and the second connection part and the gate line are arranged on different layers.

4. The drive backplane according to claim 2, wherein the first connection part and the second connection part are arranged on the same layer, but arranged on a different layer from the gate line and the bus line.

5. The drive backplane according to claim 2, wherein the circuit layer further comprises a power line, a data line, and a reset signal line, wherein both the power line and the data line extend along the column direction and are arranged along the row direction, the power line and the data line are arranged on the same layer as the bus line, the reset signal line extends along the row direction and is arranged along the column direction, and the reset signal line is located on a different layer from the gate line and the bus line;

the gate line comprises a first gate line and a second gate line;

the pixel circuit comprises a storage capacitor and a plurality of transistors, and the transistor comprises a drive transistor, a write transistor, a compensation transistor, and a first reset transistor, wherein gates of the compensation transistor and the write transistor are connected to the first gate line, the drive transistor has a first terminal connected to the power line and a second terminal connected to a light-emitting device, the compensation transistor is connected to the second terminal and the gate of the drive transistor, the write transistor has a first terminal connected to the data line and a second terminal connected to the first terminal of the drive transistor, the first reset transistor has a gate connected to the second gate line, a first terminal connected to the reset signal line, and a second terminal connected to the gate of the drive transistor, and the storage capacitor has a first plate connected to the gate of the drive transistor and a second plate connected to the power line; and the first gate line connecting the pixel circuit in the n-th row and the second gate line connecting the pixel circuit in the (n+1)-th row are connected to the same gate shift register unit through the same gate connection line.

6. The drive backplane according to claim 5, wherein the circuit layer comprises:

a semiconductor layer, provided on a side of the substrate and comprising a channel of each transistor;

a first gate insulation layer, covering the semiconductor layer;

a first gate layer, provided on a surface of the first gate insulation layer away from the substrate, and comprising the gate line, the first plate, and the gate of each transistor;

a second gate insulation layer, covering the first gate layer;

a second gate layer, provided on a surface of the second gate insulation layer away from the substrate, and comprising the second plate and the reset signal line;

a dielectric layer, covering the second gate layer;

a source and drain layer, provided on a side of the dielectric layer away from the substrate, and comprising the bus line, the power line, and the data line.

7. The drive backplane according to claim 6, wherein the first connection part and the gate line are arranged on the same layer, but arranged on a different layer from the second connection part, and the first connection part is connected to the second gate line, the second connection part is located on the source and drain layer and extends along the column direction, and the second connection part is connected to the first gate line through a contact hole.

8. The drive backplane according to claim 6, wherein the first connection part and the second connection part are arranged on the same layer, and the gate connection line is located on the second gate layer.

9. The drive backplane according to claim 8, wherein the first connection part is connected to the gate shift register unit and the second gate line through contact holes;

the second connection part extends along the column direction and is connected to the first connection part; and the second connection part is connected to the first gate line through a contact hole.

10. The drive backplane according to claim 6, wherein the gate line further comprises a third gate line, and the pixel circuit further comprises a second reset transistor, a first light emission control transistor, and a second light emission control transistor;

the first light emission control transistor has a gate connected to the third gate line, a first terminal connected to the power line, and a second terminal connected to the first terminal of the drive transistor;

the second light emission control transistor has a gate connected to the third gate line, a first terminal connected to the second terminal of the drive transistor, and a second terminal connected to the light emitting device; and the second reset transistor has a gate connected to the first gate line, a first terminal connected to the reset signal line, and a second terminal connected to the second terminal of the second light emission control transistor.

11. The drive backplane according to claim 10, wherein the circuit layer further comprises:

a light emission control circuit, located in the control area, and comprising a plurality of light emission shift register units cascaded along the column direction; and a plurality of light emission connection lines, wherein one of the light emission shift register units is connected to one of the light emission connection lines, and at least part of one of the light emission connection lines is located on a different layer from the third gate line, and is connected to one of the third gate lines through a contact hole.

12. The drive backplane according to claim 11, wherein the light emission connection line is located on the second gate layer, and is connected to the light emission shift register unit and the third gate line through contact holes.

13. The drive backplane according to claim 11, wherein the light emission connection line comprises a third connection part and a fourth connection part, wherein the third connection part is arranged on the same layer as the gate line, and is connected with the light emission shift register unit;

the third connection part passes through the bus area along the direction; and the fourth connection part is located on the source and drain layer or the second gate layer, and is connected to the third connection part and the third gate line through contact holes.

14. The drive backplane according to claim 11, wherein the second reset transistor of the pixel circuit in the n-th row is connected to the second gate line of the pixel circuit in the (n+1)-th row.

15. The drive backplane according to claim 6, wherein the bus line comprises a test bus line, a reset bus line, and a power bus line located on the source and drain layer, the power line being connected to the power bus line, and the reset signal line being connected to the reset bus line.

16. The drive backplane according to claim 15, wherein the reset bus line is located between the test bus line and the pixel area;

the second connection part is located at a side of the reset bus line away from the test bus line, and is arranged adjacent to the reset bus line; and a distance along the row direction between the second connection part and the reset bus line is 3 μm-10 μm.

17. The drive backplane according to claim 15, wherein a width of the second connection part is 20%-40% of a width of the reset bus line.

18. The drive backplane according to claim 15, wherein the control area of the drive backplane comprises a lead-out area, the lead-out area extending along the row direction and being spaced apart from the pixel area along the column direction;

the bus line, the data line, and the power line are connected to the lead-out area;

the bus area comprises side bus areas arranged on both sides of the pixel area along the row direction and a connection bus area connected between the two side bus areas, the connection bus area being located between the lead-out area and the pixel area; and the power bus line is located in the connection bus area.

19. A display panel, comprising a drive backplane, wherein the drive backplane comprises a pixel area and a control area outside the pixel area, wherein the control area comprises a circuit area and a bus area between the circuit area and the pixel area;

the drive backplane comprises a substrate and a circuit layer provided on a side of the substrate; and the circuit layer comprises:

a plurality of pixel circuits, provided in an array in the pixel area;

a plurality of gate lines, extending along a row direction and arranged along a column direction, the pixel circuits in one row being connected to at least one of the gate lines;

a gate drive circuit, provided in the control area and comprising a plurality of gate shift register units cascaded along the column direction;

bus lines, provided in the bus area, at least some of the bus lines being located between the gate drive circuit and the pixel area; and a plurality of gate connection lines, wherein one of the gate shift register units is connected to one of the gate connection lines;

at least part of one of the gate connection lines is located on a different layer from the gate line and connected to at least one of the gate lines through a contact hole, and the gate connection line is insulated from the bus line.

20. A display apparatus, comprising a display panel, wherein the display panel comprises a drive backplane, and the drive backplane comprises a pixel area and a control area outside the pixel area, wherein the control area comprises a circuit area and a bus area between the circuit area and the pixel area;

the drive backplane comprises a substrate and a circuit layer provided on a side of the substrate; and the circuit layer comprises:

a plurality of pixel circuits, provided in an array in the pixel area;

a plurality of gate lines, extending along a row direction and arranged along a column direction, the pixel circuits in one row being connected to at least one of the gate lines;

a gate drive circuit, provided in the control area and comprising a plurality of gate shift register units cascaded along the column direction;

bus lines, provided in the bus area, at least some of the bus lines being located between the gate drive circuit and the pixel area; and a plurality of gate connection lines, wherein one of the gate shift register units is connected to one of the gate connection lines;

at least part of one of the gate connection lines is located on a different layer from the gate line and connected to at least one of the gate lines through a contact hole, and the gate connection line is insulated from the bus line.

* * * * *